United States Patent
Chandrashekar et al.

(10) Patent No.: US 12,173,399 B2
(45) Date of Patent: Dec. 24, 2024

(54) REDUCING LINE BENDING DURING METAL FILL PROCESS

(71) Applicant: Lam Research Corporation, Fremont, CA (US)

(72) Inventors: Anand Chandrashekar, Fremont, CA (US); Lei Guo, San Jose, CA (US); Tsung-Han Yang, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 17/634,067

(22) PCT Filed: Aug. 18, 2020

(86) PCT No.: PCT/US2020/070429
§ 371 (c)(1),
(2) Date: Feb. 9, 2022

(87) PCT Pub. No.: WO2021/035254
PCT Pub. Date: Feb. 25, 2021

(65) Prior Publication Data
US 2022/0349048 A1 Nov. 3, 2022

Related U.S. Application Data

(60) Provisional application No. 62/891,853, filed on Aug. 26, 2019, provisional application No. 62/890,047, filed on Aug. 21, 2019.

(51) Int. Cl.
*C23C 16/34* (2006.01)
*C23C 16/02* (2006.01)
*C23C 16/455* (2006.01)

(52) U.S. Cl.
CPC .......... *C23C 16/34* (2013.01); *C23C 16/0281* (2013.01); *C23C 16/45553* (2013.01)

(58) Field of Classification Search
None
See application file for complete search history.

(56) References Cited

U.S. PATENT DOCUMENTS

| | | | |
|---|---|---|---|
| 5,804,249 | A | 9/1998 | Sukharev et al. |
| 6,037,252 | A | 3/2000 | Hillman et al. |
| 6,399,490 | B1 | 6/2002 | Jammy et al. |
| 8,614,106 | B2 | 12/2013 | Lavoie et al. |
| 10,573,522 | B2 | 2/2020 | Jandl et al. |
| 2007/0066060 | A1 | 3/2007 | Wang |
| 2007/0080459 | A1 | 4/2007 | Seok |

(Continued)

FOREIGN PATENT DOCUMENTS

| JP | 2002544657 A | 12/2002 |
|---|---|---|
| KR | 20070035250 A | 3/2007 |
| WO | WO-2015145750 A1 | 10/2015 |

OTHER PUBLICATIONS

International Preliminary Report on Patentability dated Mar. 3, 2022, in Application No. PCT/US2020/070429.

(Continued)

*Primary Examiner* — Michael G Miller
(74) *Attorney, Agent, or Firm* — Weaver Austin Villeneuve & Sampson LLP

(57) ABSTRACT

Methods of mitigating line bending during feature fill include deposition of an amorphous layer and/or an inhibition treatment during fill.

21 Claims, 22 Drawing Sheets

(56) References Cited

U.S. PATENT DOCUMENTS

| | | | |
|---|---|---|---|
| 2008/0011228 A1 | 1/2008 | Inoue et al. | |
| 2008/0280438 A1* | 11/2008 | Lai | H01L 21/7687 |
| | | | 257/E21.585 |
| 2009/0277867 A1 | 11/2009 | Mayer et al. | |
| 2009/0280649 A1 | 11/2009 | Mayer et al. | |
| 2011/0221044 A1* | 9/2011 | Danek | H01L 21/76873 |
| | | | 257/E21.597 |
| 2012/0107503 A1 | 5/2012 | Abelson et al. | |
| 2012/0153381 A1 | 6/2012 | Song | |
| 2012/0187305 A1 | 7/2012 | Elam et al. | |
| 2014/0106083 A1 | 4/2014 | Wu et al. | |
| 2014/0187038 A1 | 7/2014 | Collins et al. | |
| 2014/0231896 A1 | 8/2014 | Matsumori et al. | |
| 2014/0264932 A1 | 9/2014 | Ting et al. | |
| 2015/0299886 A1 | 10/2015 | Doubina et al. | |
| 2016/0172211 A1 | 6/2016 | Demos et al. | |
| 2017/0125548 A1 | 5/2017 | Hung et al. | |
| 2017/0194204 A1 | 7/2017 | Sowa | |
| 2017/0229341 A1 | 8/2017 | Chang et al. | |
| 2017/0365513 A1 | 12/2017 | Yang et al. | |
| 2018/0053660 A1* | 2/2018 | Jandl | C23C 16/14 |
| 2020/0303409 A1 | 9/2020 | Lim et al. | |
| 2024/0158913 A1 | 5/2024 | Chandrashekar et al. | |

OTHER PUBLICATIONS

International Search Report and Written Opinion dated Jun. 17, 2022, in PCT Application No. PCT/US2022/019195.

International Search Report and Written Opinion dated Nov. 30, 2020, in application No. PCT/US2020/070429.

U.S. Corrected Notice of Allowance dated Feb. 16, 2022, in U.S. Appl. No. 16/724,231.

U.S. Corrected Notice of Allowance dated May 11, 2022, in U.S. Appl. No. 16/724,231.

US Final Office Action dated Jun. 10, 2019 issued in U.S. Appl. No. 15/673,320.

US Final Office Action dated Mar. 29, 2021 issued in U.S. Appl. No. 16/724,231.

U.S. Notice of Allowance dated Feb. 2, 2022 in U.S. Appl. No. 16/724,231.

US Notice of Allowance dated Sep. 26, 2019 issued in U.S. Appl. No. 15/673,320.

US Notice of allowance dated Sep. 29, 2021 issued in U.S. Appl. No. 16/724,231.

US Office Action dated Dec. 21, 2018 issued in U.S. Appl. No. 15/673,320.

US Office Action dated Sep. 22, 2020 issued in U.S. Appl. No. 16/724,231.

International Preliminary Report on Patentability dated Sep. 28, 2023, in PCT Application No. PCT/US2022/019195.

SG Search Report and Written Opinion dated May 28, 2024 in SG Application No. 11202201606P.

JP Office Action dated Jul. 9, 2024 in JP Application No. 2022-510890, with English Translation.

* cited by examiner

Constrictions
351

REDUCING LINE BENDING DURING METAL FILL PROCESS

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

Deposition of conductive materials is an integral part of many semiconductor fabrication processes. These materials may be used for horizontal interconnects, vias between adjacent metal layers, contacts between metal layers and devices on the silicon substrate, and high aspect ratio features. In an example of a deposition process on a semiconductor substrate, the substrate is heated to a process temperature in a vacuum chamber, and a very thin portion of film, which serves as a seed or nucleation layer, is deposited. Thereafter, the remainder of the film (the bulk layer) is deposited on the nucleation layer by exposing the substrate to two reactants simultaneously. The bulk layer is generally deposited more rapidly than the nucleation layer. However, as devices shrink and more complex patterning schemes are utilized in the industry, deposition of thin films to fill features becomes a challenge.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Methods of mitigating line bending during feature fill are described. The methods may be used to mitigate line bending during fill of adjacent features. In some embodiments, the methods include deposition of amorphous metal-based layers. In some embodiments, the methods include deposition of metal-based layers that include impurities. According to various embodiments, the metal-based layers can mitigate stress and/or interrupt metal-metal bonding that can cause line bending. In some embodiments, the methods include a surface treatment of a layer with an inhibition chemistry. According to various embodiments, the surface treatment can roughen the surface and reduce line bending.

One aspect of the disclosure relates to a method including: (a) providing a substrate having a plurality of features spaced apart, each feature having a feature opening width, wherein the width of the feature narrows from the top of the feature to the bottom of the feature; (b) conformally treating the surface by exposing it to a metal-containing precursor and an inhibition chemistry; (c) after treating the surface, depositing a bulk metal layer in the features.

In some embodiments, the width of the bottom of each feature is between 0 nm and 90% of the width at the top of the feature. In some embodiments, the metal is selected from the group consisting of tungsten, ruthenium, molybdenum, and cobalt. In some embodiments, operations (b) and (c) are repeated one or more times to fill the features. In some embodiments, the bulk metal layer deposited in (c) completely fills the features. In some embodiments, operation (b) is performed without depositing a continuous film in the feature. In some embodiments, operation (b) includes a non-uniform adsorption of the metal precursor and inhibition compound. In some embodiments, operation (b) includes deposition of a discontinuous film. In some embodiments, the method further includes depositing a nucleation layer on in the features such that (b) includes treating the nucleation layer surface. In some embodiments, operation (b) increases the surface roughness of the bulk metal layer. In some embodiments, operation (b) is a non-plasma thermal process. In some embodiments, operation (b) is a plasma-based process. In some embodiments, the inhibition chemistry includes a nitrogen-containing compound. In some embodiments, the inhibition chemistry is ammonia.

Another aspect of the disclosure relates to a method including: (a) providing a substrate having a plurality of features spaced apart, each feature having a feature opening width, wherein the width of at least some of the features narrows from the top of the feature to the bottom of the feature; (b) depositing a conformal amorphous metal-based layer in the features; and (c) after depositing the conformal amorphous metal-based layer, depositing a bulk metal layer in the features. In some embodiments, the width of the bottom of each feature is between 0 nm and 90% of the width at the top of the feature. In some embodiments, the metal is selected from the group consisting of tungsten, ruthenium, molybdenum, and cobalt. In some embodiments, operations (b) and (c) are repeated one or more times to fill the features. In some embodiments, the method further includes annealing the conformal amorphous metal-based layer.

In some embodiments, the features are spaced apart with a pitch of between about 10 nm and 60 nm between adjacent features. In some embodiments, the methods further involve depositing a metal nucleation layer in the features. In some embodiments, the metal-based layer includes at least 50 atomic % metal. In some embodiments, the metal-based layer further includes one or more of boron (B), nitrogen (N), carbon (C), silicon (Si), and germanium (Ge).

Another aspect of the disclosure relates to a method including: (a) providing a substrate having a plurality of features spaced apart, each feature having a feature opening width, wherein the width of the feature narrows from the top of the feature to the bottom of the feature; (b) depositing a bulk metal layer in the features; and (c) after depositing the bulk metal layer in the features, depositing an amorphous metal-based layer in the features.

In some embodiments, the width of the bottom of each feature is between 0 nm and 90% of the width at the top of each feature. In some embodiments, the metal is selected from the group consisting of tungsten, ruthenium, molybdenum, and cobalt. In some embodiments, the method further includes repeating (b) one or more times to fill the feature. In some such embodiments, the method further includes repeating (c) one or more times to fill the feature. In some embodiments, the method further includes annealing the conformal amorphous metal-based layer. In some embodiments, the features are spaced apart with a pitch of between about 10 nm and 60 nm between adjacent features. In some embodiments, the method further includes depositing a metal nucleation layer in the features. In some embodiments, the metal-based layer includes at least 50% metal. In some embodiments, the metal-based layer further includes one or more of boron (B), nitrogen (N), carbon (C), silicon (Si), and germanium (Ge).

Another aspect of the disclosure relates to a method including providing a substrate having a plurality of features spaced apart, each feature having a feature opening width, wherein the width of at least some of the features narrows from the top of the feature to the bottom of the feature; and depositing a conformal metal-based layer in the features, wherein the metal-based layer comprises a metal selected from tungsten (W), ruthenium (Ru), molybdenum (Mo), titanium (Ti), tantalum (Ta), and cobalt (Co) and wherein the metal-based layer is at least 5% (atomic) of an impurity selected from boron (B), nitrogen (N), carbon (C), silicon (Si), germanium (Ge), and combinations thereof. In some embodiments, the plurality of features are filled with a film selected from titanium nitride and tantalum nitride.

These and other aspects of the disclosure are described further below with reference to the drawings.

DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with specific embodiments, it will be understood that it is not intended to limit the disclosed embodiments.

Metal fill, such as tungsten (W) fill, of features is often used in semiconductor device fabrication to form electrical contacts. There are various challenges in tungsten fill as devices scale to smaller technology nodes and more complex patterning structures are used. One challenge is reducing the fluorine concentration or content in the deposited tungsten film. As compared to larger features, a smaller feature having the same fluorine concentration in the tungsten film as a larger feature affects the performance of the device more substantially. For example, the smaller the feature, the thinner the films are deposited. As a result, fluorine in the deposited tungsten film is more likely to diffuse through the thinner films, thereby potentially causing device failure.

Figure 1:
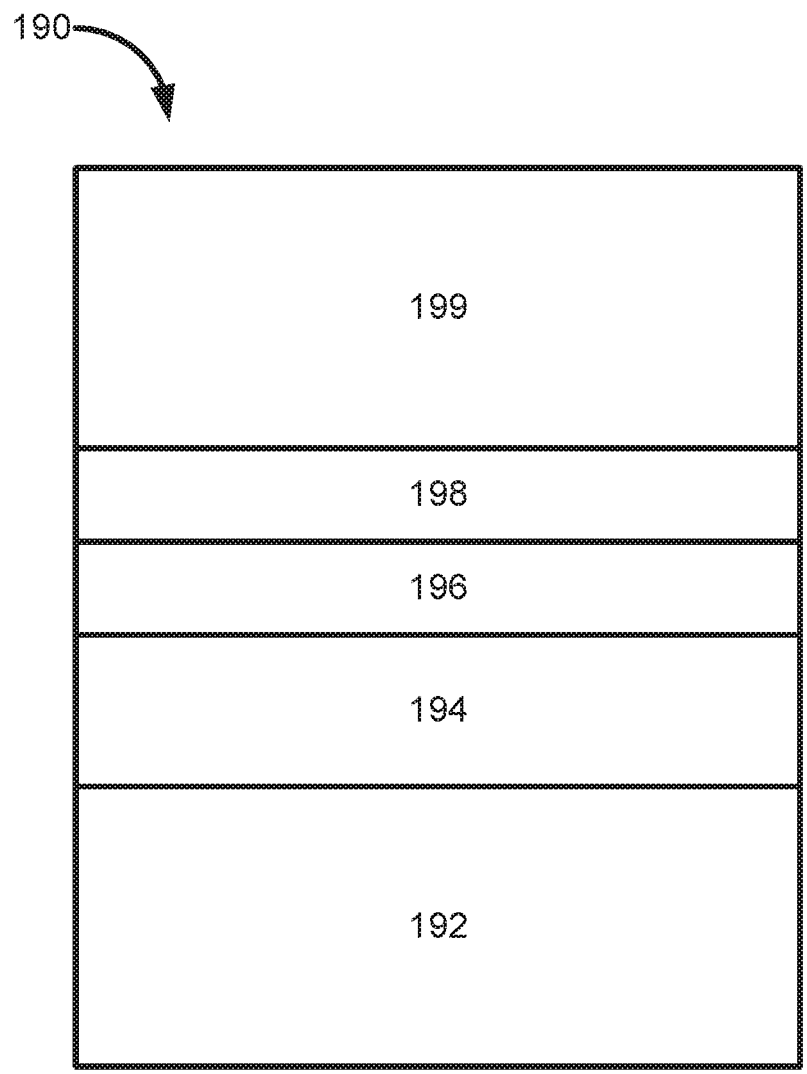
FIG. 1 is a schematic illustration of example films on a substrate.

One method of preventing fluorine diffusion includes depositing one or more barrier layers prior to depositing tungsten to prevent fluorine from diffusing from tungsten to other layers of the substrate such as an oxide layer. For example, FIG. 1 shows an example stack of layers deposited on a substrate 190. Substrate 190 includes a silicon layer 192, an oxide layer 194 (e.g., titanium oxide (TiOx), tetraethyl orthosilicate (TEOS) oxide, etc.), a barrier layer 196 (e.g., titanium nitride (TiN)), a tungsten nucleation layer 198, and a bulk tungsten layer 199. Barrier layer 196 is deposited to prevent fluorine diffusion from the bulk tungsten layer 199 and the tungsten nucleation layer 198 to the oxide layer 194. However, as devices shrink, barrier layers become thinner, and fluorine may still diffuse from the deposited tungsten layers. Although chemical vapor deposition (CVD) of bulk tungsten performed at a higher temperature results in lower fluorine content, such films have poor step coverage.

Another challenge is reducing resistance in the deposited tungsten films. Thinner films tend to have higher resistance than thicker films. As features become smaller, the tungsten contact or line resistance increases due to scattering effects in the thinner tungsten films. Low resistivity tungsten films minimize power losses and overheating in integrated circuit designs. Tungsten nucleation layers typically have higher electrical resistivities than the overlying bulk layers. Barrier layers deposited in contacts, vias, and other features, may also have high resistivities. Further, thin barrier and tungsten nucleation films occupy a larger percentage of smaller features, increasing the overall resistance in the feature. Resistivity of a tungsten film depends on the thickness of the film deposited, such that resistivity increases as thickness decreases due to boundary effects.

Another challenge is reducing stress on deposited films. Thinner tungsten films tend to have increased tensile stress. Conventional techniques for depositing bulk tungsten films by chemical vapor deposition have a tensile stress greater than 2.5 GPa for a 200 Å film. High thermal tensile stress causes the substrate to curl, which makes subsequent processing difficult. For example, subsequent processes may include chemical mechanical planarization, deposition of materials, and/or clamping of the substrate to a substrate holder to perform processes in a chamber. However, these processes often rely on the substrate being flat, and a curled substrate results in non-uniform processing or inability to process the substrate. Although there are existing methods for reducing stress in films of other materials such as annealing, tungsten does not have the surface mobility to allow grains to be moved or altered once it is deposited due to its high melting point.

Another challenge is reducing line bending, a phenomenon found in, for example, substrates having multiple features with narrow pitch, or in substrates multiple high aspect ratio features adjacent to one another. Line bending in dynamic random-access memory (DRAM) buried wordline structures (bWL) during tungsten fill is believed to be caused by grain boundary merging (which may be referred to as a "zipping" mechanism). When the grain boundaries are formed, the metal-metal bonding between adjacent tungsten surfaces (such as the growing tungsten film on sidewalls of a feature) causes strain that leads to bending of the silicon fins (lines) separating the bWL. Atomic layer deposition (ALD) and CVD tungsten fill techniques can result in severe bending of the bWL structures. This line bending will cause tungsten recess non-uniformity and contact landing issues in downstream processes, which results in DRAM yield loss.

ALD can be used to form exhibit low stress, low fluorine, and low resistivity tungsten films but only on surfaces that allow for such growth. As devices shrink and features are narrower, there may be a zipping mechanism, which can cause tensile stress, high incorporation of fluorine, and impact on resistivity resulting in rough morphology.

Figure 2A:
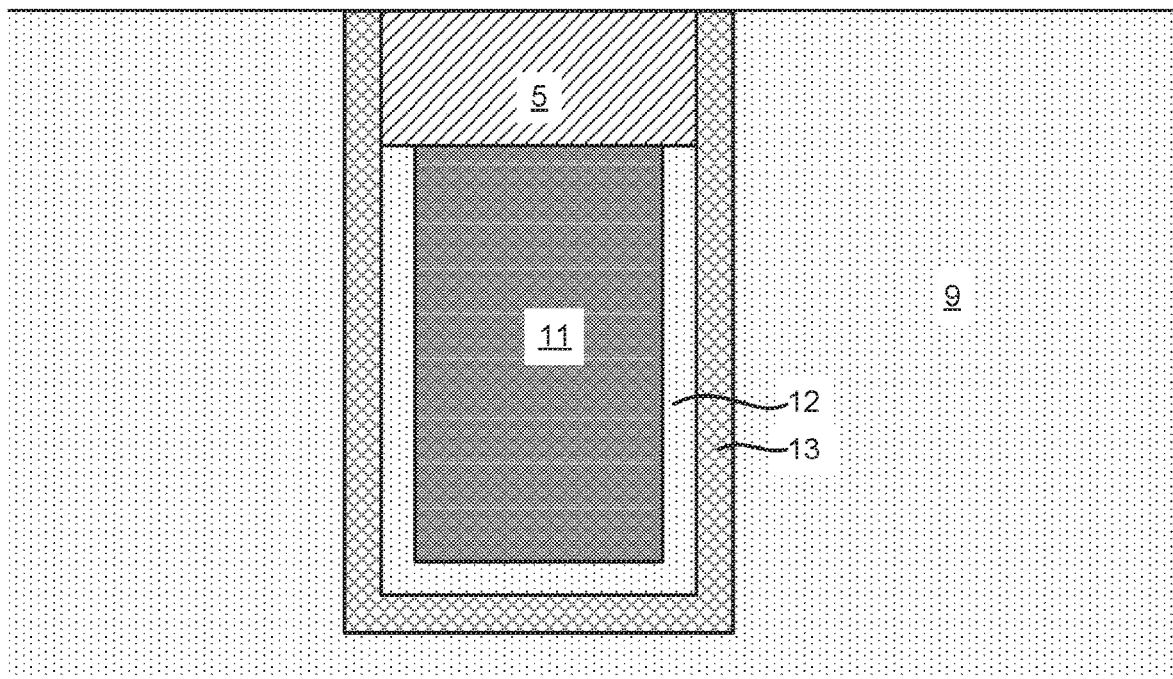
FIG. 2A depicts a schematic illustration of an example of a dynamic random access memory (DRAM) architecture including a buried wordline (bWL) in a silicon substrate.

Particular embodiments relate to methods and related apparatus for formation of tungsten wordlines in memory devices. FIG. 2A depicts a schematic example of a DRAM architecture including a buried wordline (bWL) 11 in a silicon substrate 9. The bWL 11 is formed in a trench etched in the silicon substrate 9. The bWL 11 is tungsten deposited in the silicon substrate 9 and is capped by SiN passivation 5. Lining the trench is a conformal barrier layer 12 and an insulating layer 13 that is disposed between the conformal barrier layer 12 and the silicon substrate 9. In the example of FIG. 2A, the insulating layer 13 may be a gate oxide layer, formed from a material such as a silicon oxide. Examples of conformal barrier layers include TiN and tungsten-containing barrier layers. Tungsten-containing conformal barrier layers can include binary compounds such as $WB_x$, $WSi_x$, $WGe_x$, $WC_x$, $WN_x$, and ternary compounds such as $WB_xN_y$, $WSi_xN_y$, $WGe_xN_y$, $WSi_xC_y$, $WB_xC_y$, $WGe_xC_y$, $WC_xN_y$, and quaternary compounds such as $WB_xGe_yN_z$, $WGe_xC_yN_z$, etc. wherein x, y and z are numbers greater than zero.

Figure 2B:
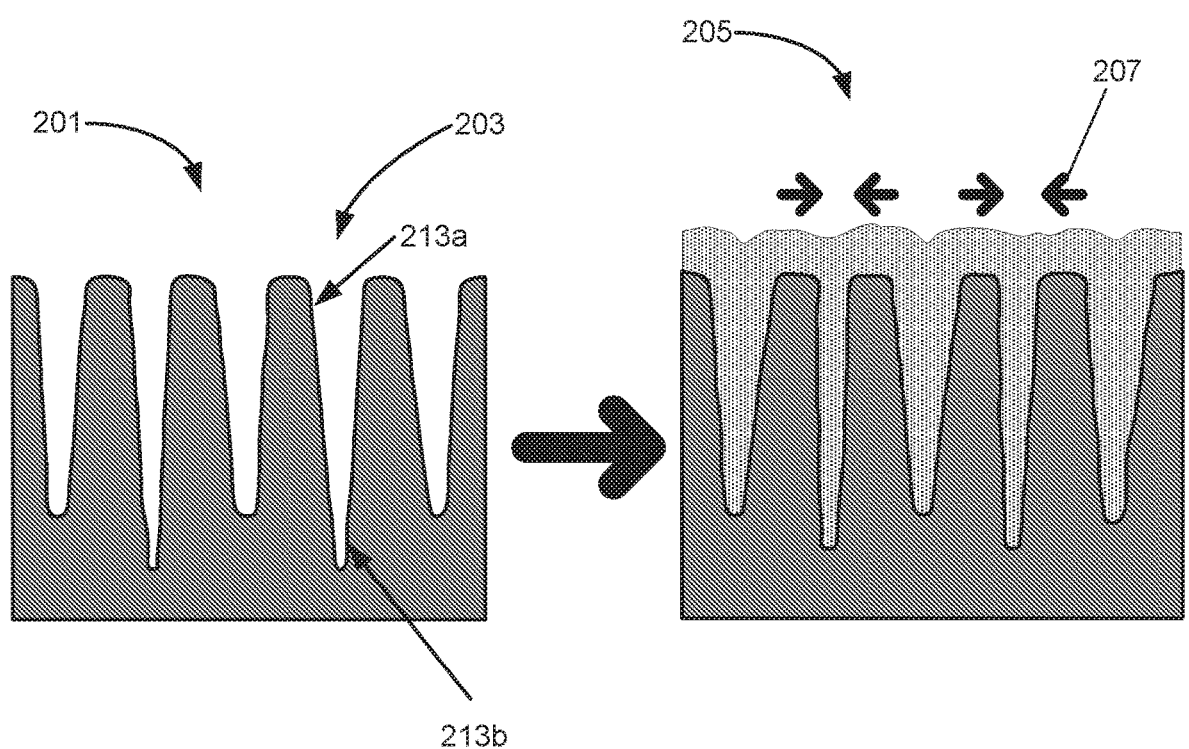
FIG. 2B depicts a schematic illustration of line bending.
Figure 2C:
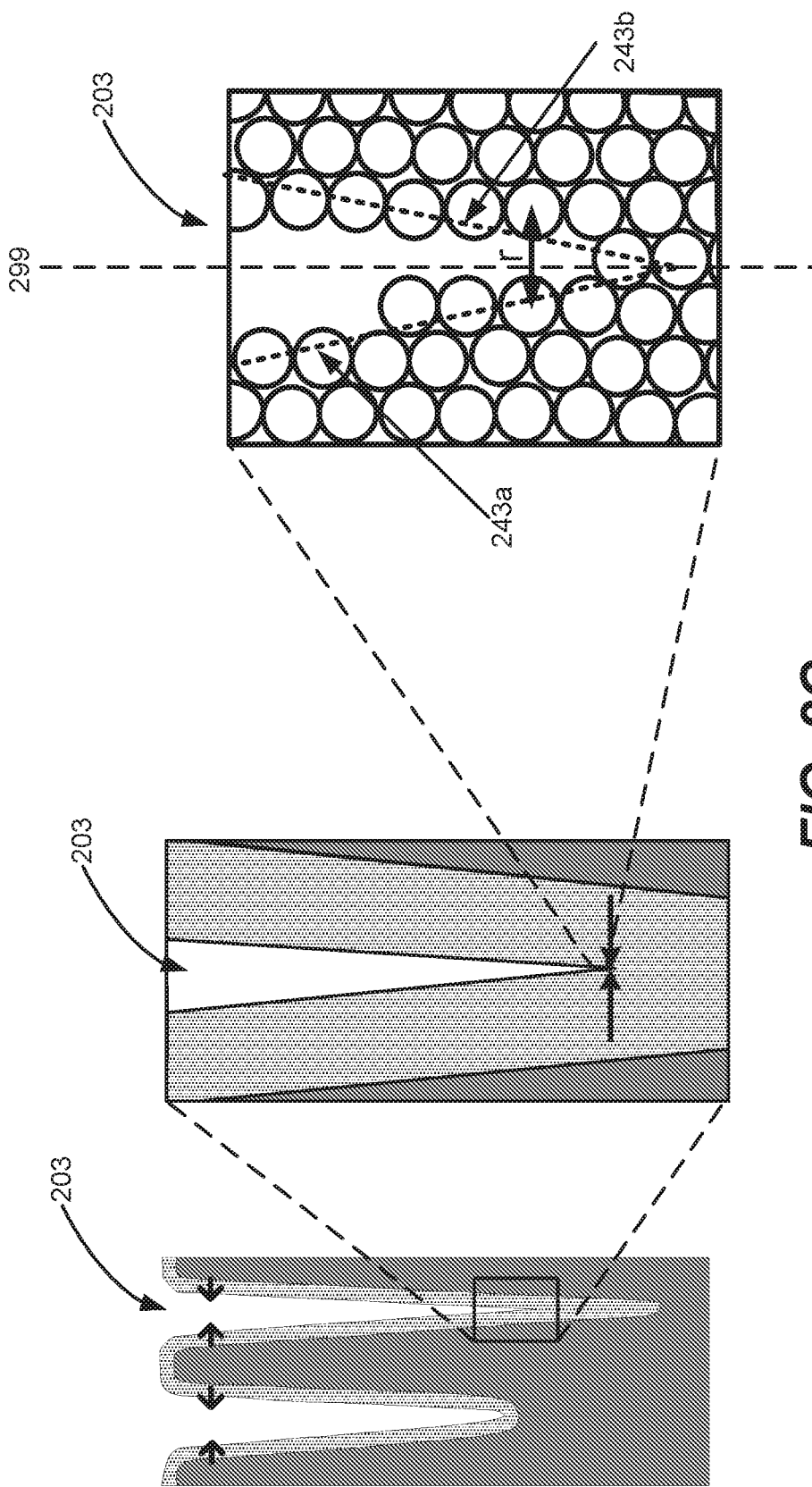
FIG. 2C depicts a schematic illustration of a zipping phenomenon.
Figure 2D:
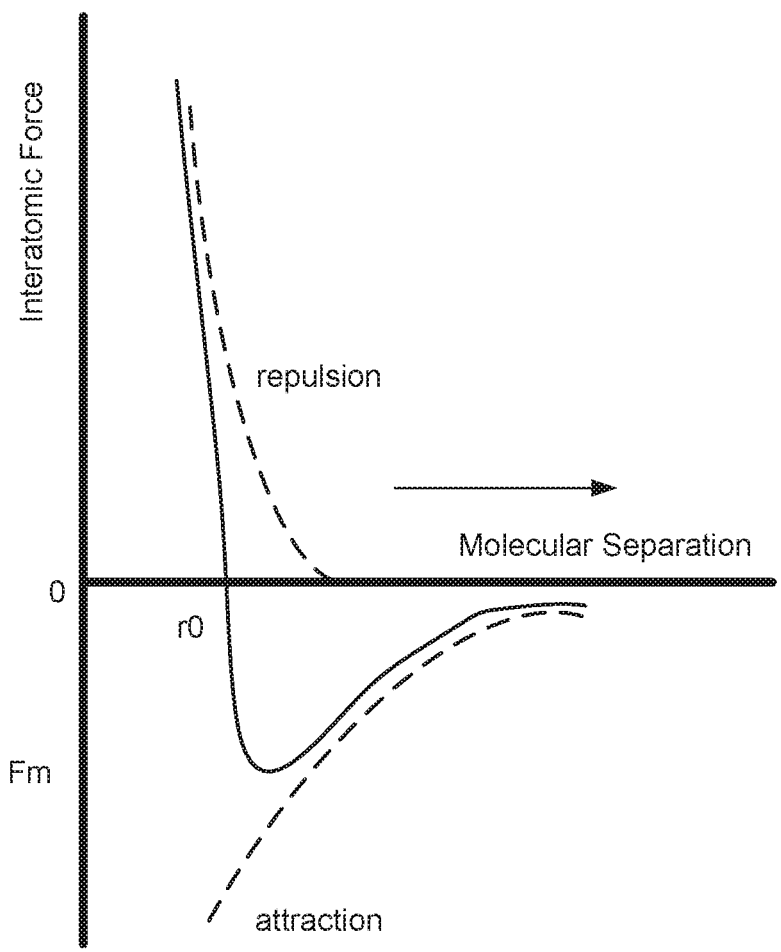
FIG. 2D is a graph showing the interatomic force as a function of tungsten-tungsten bond radius.

Fill processes for DRAM bWL trenches can distort the trenches such that the final trench width and resistance Rs are significantly non-uniform. FIG. 2B shows an unfilled (201) and filled (205) narrow asymmetric trench structure DRAM bWL that exhibit line bending after fill. As shown, multiple features are depicted on a substrate. These features are spaced apart, and in some embodiments, adjacent features have a pitch between about 5 nm and about 60 nm, or about 20 nm and about 60 nm, or between about 10 nm and 30 nm, or between about 10 nm and 40 nm, or between about 20 nm and 40 nm. The pitch is defined as the distance between the middle axis of one feature to the middle axis of an adjacent feature. The unfilled features may be generally V-shaped as shown in feature 203, having sloped sidewalls where the width of the feature narrows from the top of the feature to the bottom of the feature. The features widen from the feature bottom 213b to the feature top 213a. After tungsten fill, severe line bending is observed in substrate 205. Without being bound by a particular theory, it is believed that a cohesive force between opposing surfaces of a trench pulls the trench sides together as depicted by arrows 207. This phenomena is illustrated in FIG. 2C, and may be characterized as "zipping up" the feature. As the feature 203 is filled, more force is exerted from a center axis 299 of the feature 203, causing line bending. Deposited tungsten 243a and 243b on sidewalls of feature 203 thereby interact in close proximity, where tungsten-tungsten bond radius r is small, thereby causing cohesive interatomic forces between the smooth growing surfaces of tungsten and pulling the sidewalls together, thereby causing line bending. FIG. 2D illustrates the interatomic force as a function of tungsten-tungsten bond radius, r. As can be seen, a cohesive force exists at certain values of r. Even low stress tungsten films deposited by ALD processes can cause severe line bending during the fill. While V-shaped features are described herein, the methods may be applied advantageously with features of any profile that undergo line bending during feature fill.

Described herein are methods of filling features with metal and related systems and apparatuses to reduce line bending. Although various examples and embodiments herein are described with respect to tungsten, it will be understood that disclosed embodiments are suitable for depositing a variety of metals, including but not limited to ruthenium, molybdenum, cobalt, and more. Examples of applications include logic and memory contact fill, DRAM buried wordline fill, vertically integrated memory gate/wordline fill, and 3-D integration with through-silicon vias (TSVs). The methods described herein can be used to fill vertical features, such as in tungsten vias, and horizontal features, such as 3D-NAND wordlines. The methods may be used for conformal and bottom-up or inside-out fill.

Methods described herein are performed on a substrate that may be housed in a chamber. The substrate may be a silicon wafer, e.g., a 200-mm wafer, a 300-mm wafer, or a 450-mm wafer, including wafers having one or more layers of material, such as dielectric, conducting, or semi-conducting material deposited thereon. Substrates have features such as via or contact holes, which may be characterized by one or more of V-shaped sidewalls, narrow and/or re-entrant openings, constrictions within the feature, and high aspect ratios. A feature may be formed in one or more of the above described layers. For example, the feature may be formed at least partially in a dielectric layer. In some embodiments, a feature may have an aspect ratio of at least about 2:1, at least about 4:1, at least about 6:1, at least about 10:1, or higher. One example of a feature is a hole or via in a semiconductor substrate or a layer on the substrate. Features may be spaced apart on the substrate by a pitch between adjacent features of about 20 nm to about 40 nm.

Figures 3A, 3B:
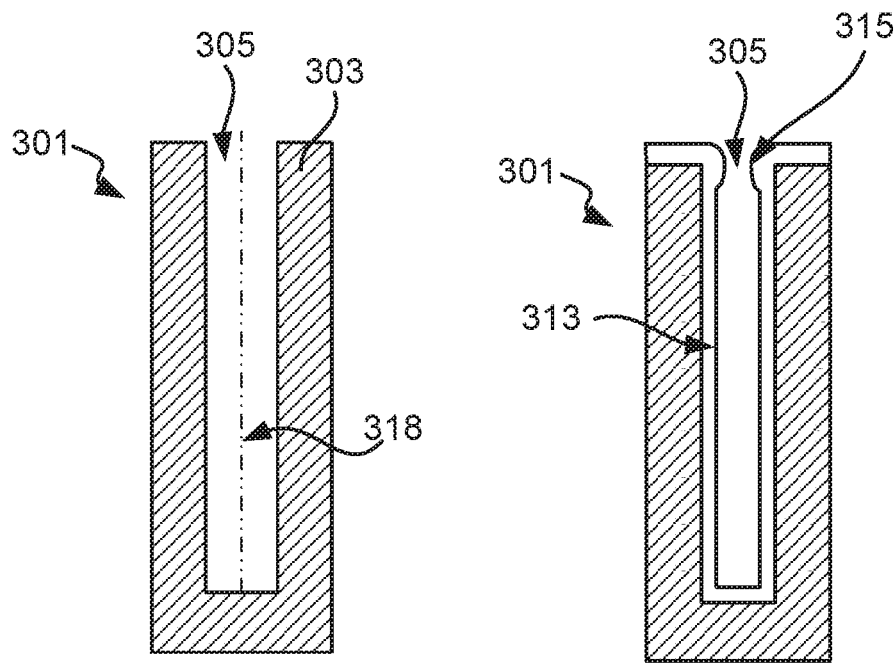
FIGS. 3A-3I are schematic examples of various structures in which a metal such as tungsten may be deposited in accordance with certain disclosed embodiments.

FIGS. 3A-3G are schematic examples of various structures in which tungsten may be deposited in accordance with disclosed embodiments. FIG. 3A shows an example of a cross-sectional depiction of a vertical feature 301 to be filled with tungsten. The feature 301 can include a feature hole 305 in a substrate 303. The hole 305 or other feature may have a dimension near the opening, e.g., an opening diameter or line width of between about 10 nm to 500 nm, for example between about 25 nm and about 300 nm. The feature hole 305 can be referred to as an unfilled feature or simply a feature. The feature 301, and any feature, may be characterized in part by an axis 318 that extends through the length of the feature through the center of the hole 305, with vertically-oriented features having vertical axes and horizontally-oriented features having horizontal axes.

In some embodiments, features are trenches in a 3D NAND structure. For example, a substrate may include a wordline structure having at least 60 lines, with 18 to 48 layers, or hundreds of layers, with trenches at least 200 Å deep or many microns dee. Another example is a trench in a substrate or layer. Features may be of any depth. In various embodiments, the feature may have an under-layer, such as a barrier layer or adhesion layer. Non-limiting examples of under-layers include dielectric layers and conducting layers, e.g., silicon oxides, silicon nitrides, silicon carbides, metal oxides, metal nitrides, metal carbides, and metal layers.

FIG. 3B shows an example of a feature 301 that has a re-entrant profile. A re-entrant profile is a profile that narrows from a bottom, closed end, or interior of the feature to the feature opening. According to various implementations, the profile may narrow gradually and/or include an overhang at the feature opening. FIG. 3B shows an example of the latter, with an under-layer 313 lining the sidewall or interior surfaces of the feature hole 305 of feature 301. The under-layer 313 can be for example, a diffusion barrier layer, an adhesion layer, a nucleation layer, a combination of thereof, or any other applicable material. Non-limiting examples of under-layers can include dielectric layers and conducting layers, e.g., silicon oxides, silicon nitrides, silicon carbides, metal oxides, metal nitrides, metal carbides, and metal layers. In particular implementations an under-layer can be one or more of Ti, TiN, WN, TiAl, and W. The under-layer 313 forms an overhang 315 such that the under-layer 313 is thicker near the opening of the feature 301 than inside the feature 301.

Figure 3D:
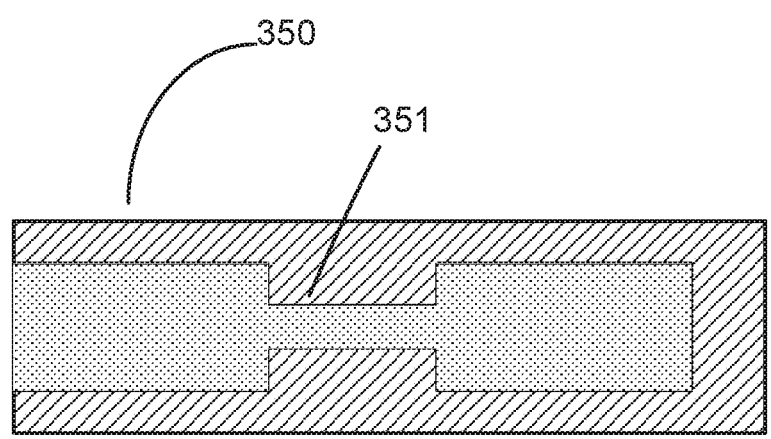
Figure 3C:
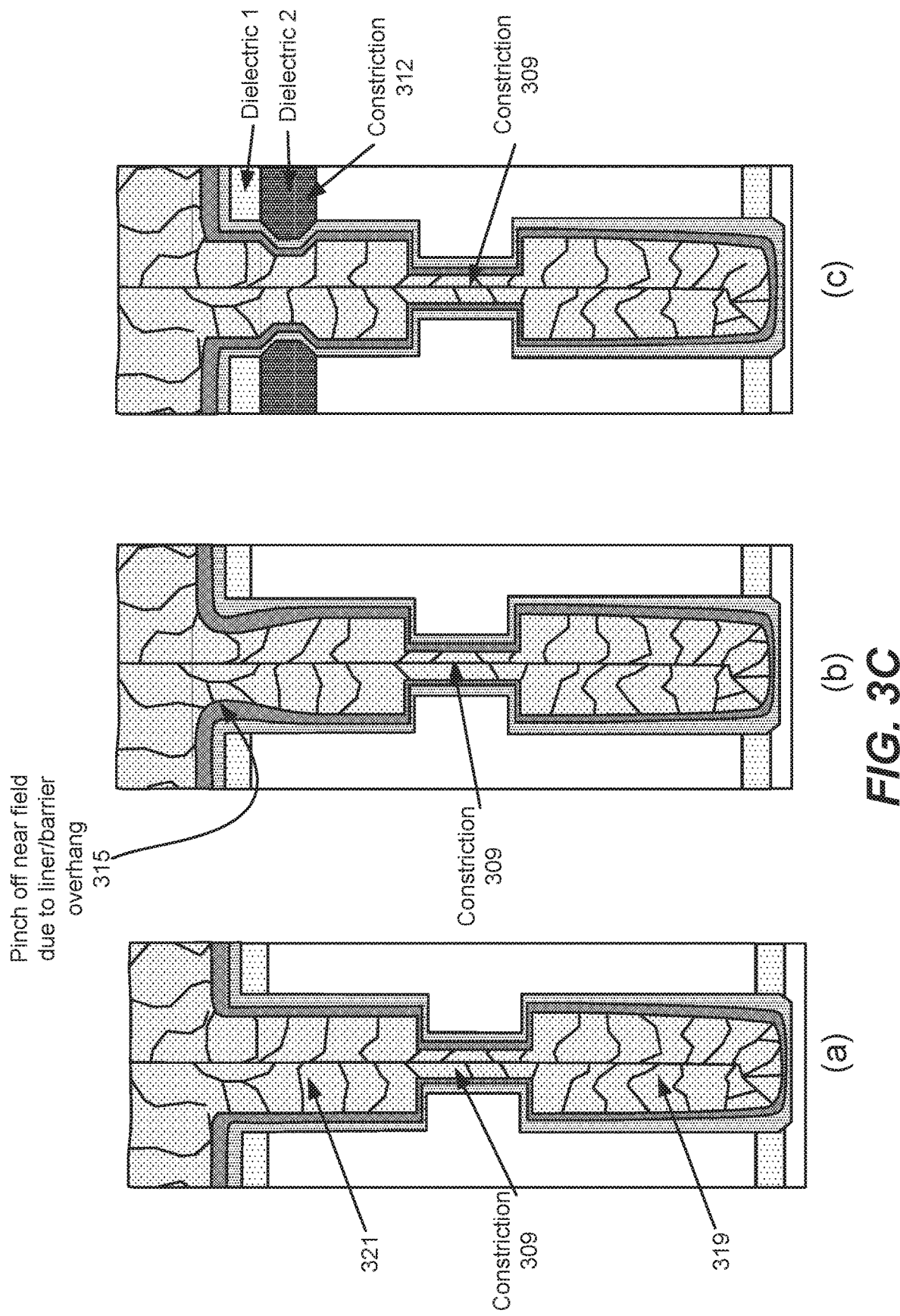

In some implementations, features having one or more constrictions within the feature may be filled. FIG. 3C shows examples of views of various filled features having constrictions. Each of the examples (a), (b) and (c) in FIG. 3C includes a constriction 309 at a midpoint within the feature. The constriction 309 can be, for example, between about 15 nm-20 nm wide. Constrictions can cause pinch off during deposition of tungsten in the feature using conventional techniques, with deposited tungsten blocking further deposition past the constriction before that portion of the feature is filled, resulting in voids in the feature. Example (b) further includes a liner/barrier overhang 315 at the feature opening. Such an overhang could also be a potential pinch-off point. Example (c) includes a constriction 312 further away from the field region than the overhang 315 in example (b).

Horizontal features, such as in 3-D memory structures, can also be filled. FIG. 3D shows an example of a horizontal feature 350 that includes a constriction 351. For example, horizontal feature 350 may be a word line in a 3D NAND structure.

Figure 3E:
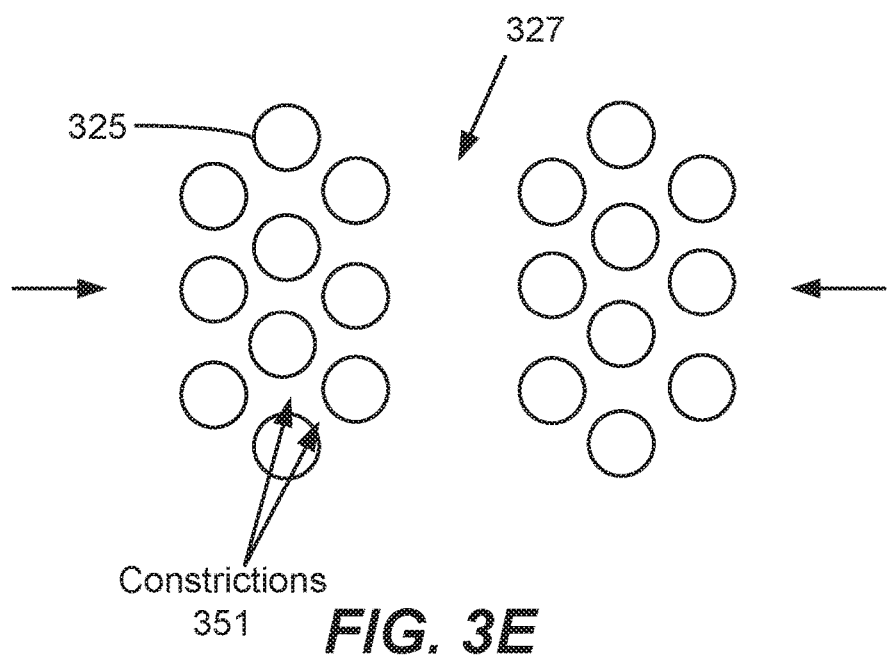
Figure 3F:
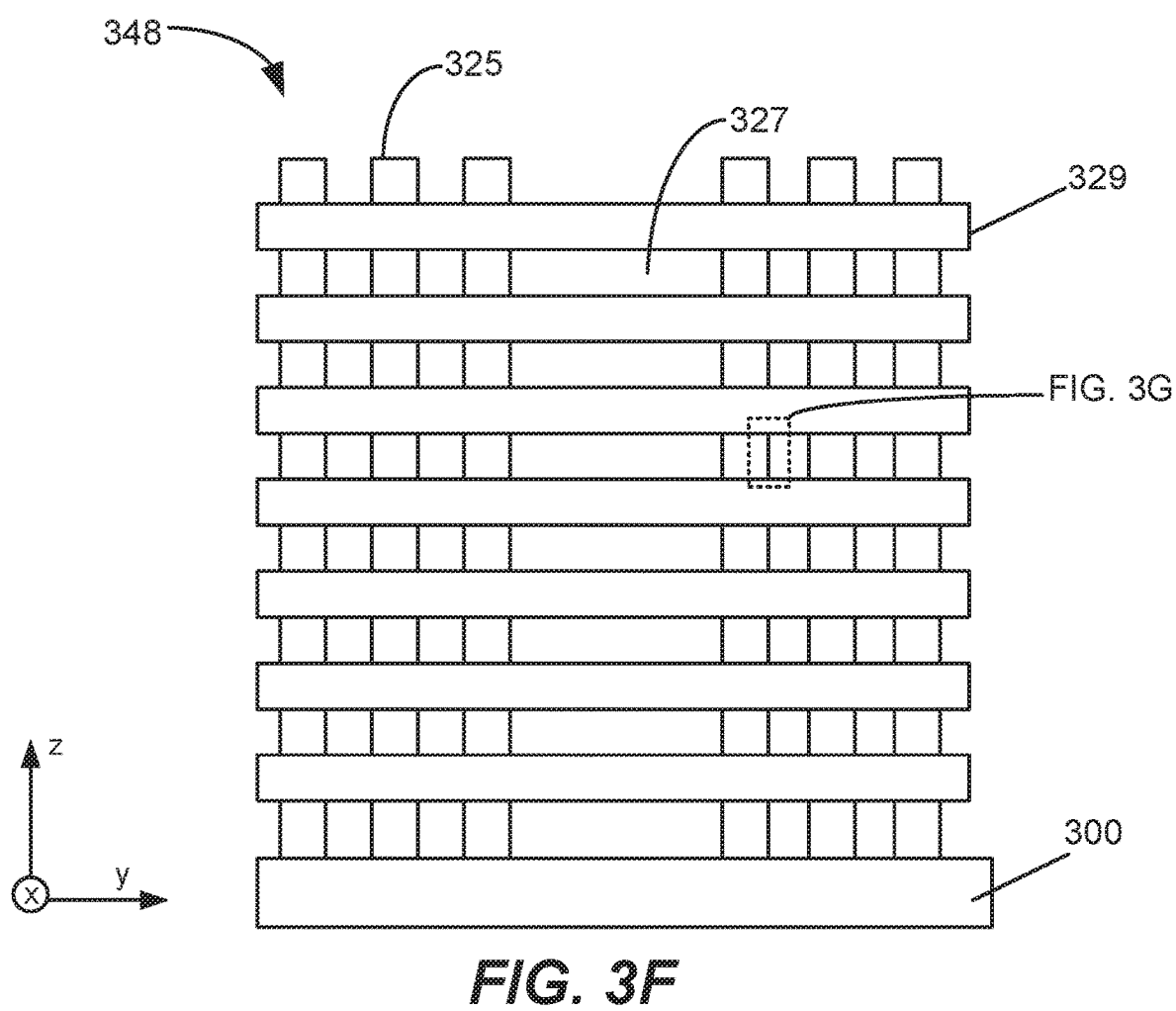

In some implementations, the constrictions can be due to the presence of pillars in a 3D NAND or other structure. FIG. 3E, for example, shows a plan view of pillars 325 in a 3D NAND or vertically integrated memory (VIM) structure 348, with FIG. 3F showing a simplified schematic of a cross-sectional depiction of the pillars 325. Arrows in FIG. 3E represent deposition material; as pillars 325 are disposed between an area 327 and a gas inlet or other deposition source, adjacent pillars can result in constrictions 351 that present challenges in void free fill of an area 327.

The structure 348 can be formed, for example, by depositing a stack of alternating interlayer dielectric layers 329 and sacrificial layers (not shown) on a substrate 300 and selectively etching the sacrificial layers. The interlayer dielectric layers may be, for example, silicon oxide and/or silicon nitride layers, with the sacrificial layers a material selectively etchable with an etchant. This may be followed by etching and deposition processes to form pillars 325, which can include channel regions of the completed memory device.

The main surface of substrate 300 can extend in the x and y directions, with pillars 325 oriented in the z-direction. In the example of FIGS. 3E and 3F, pillars 325 are arranged in an offset fashion, such that pillars 325 that are immediately adjacent in the x-direction are offset with each other in the y-direction and vice versa. According to various implementations, the pillars (and corresponding constrictions formed by adjacent pillars) may be arranged in any number of manners. Moreover, the pillars 325 may be any shape including circular, square, etc. Pillars 325 can include an annular semi-conducting material, or circular (or square) semi-conducting material. A gate dielectric may surround the semi-conducting material. The area between each interlayer dielectric layer 329 can be filled with tungsten; thus structure 348 has a plurality of stacked horizontally-oriented features that extend in the x and/or y directions to be filled.

Figure 3G:
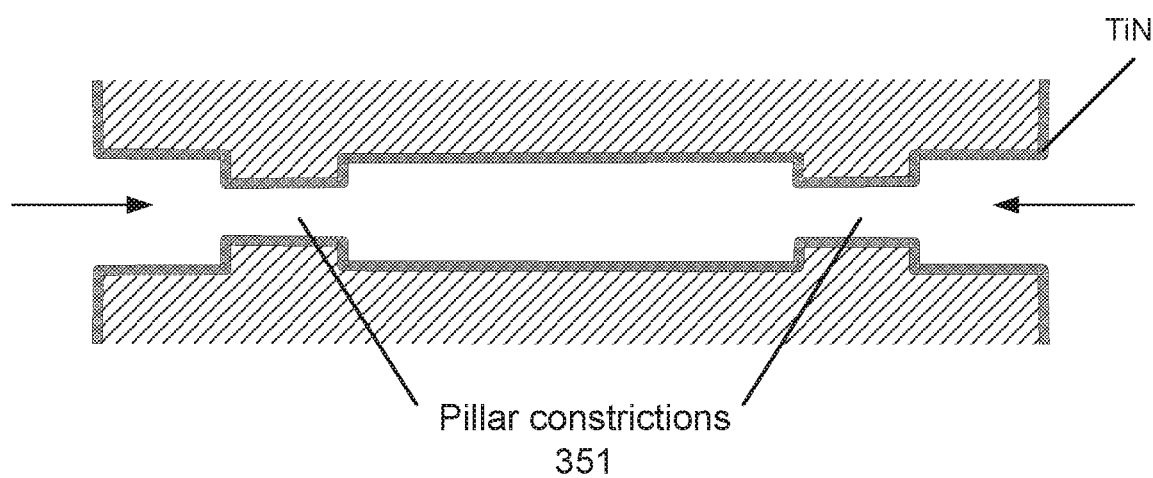

FIG. 3G provides another example of a view of a horizontal feature, for example, of a 3D NAND or other structure including pillar constrictions 351. The example in FIG. 3G is open-ended, with material to be deposited able to enter horizontally from two sides as indicated by the arrows. (It should be noted that example in FIG. 3G can be seen as a 2-D rendering 3-D features of the structure, with the FIG. 3G being a cross-sectional depiction of an area to be filled and pillar constrictions shown in the figure representing constrictions that would be seen in a plan rather than cross-sectional view.) In some implementations, 3-D structures can be characterized with the area to be filled extending along two or three dimensions (e.g., in the x and y or x, y and z-directions in the example of FIG. 3F), and can present more challenges for fill than filling holes or trenches that extend along one or two dimensions. For example, controlling fill of a 3-D structure can be challenging as deposition gasses may enter a feature from multiple dimensions.

Figure 3I:
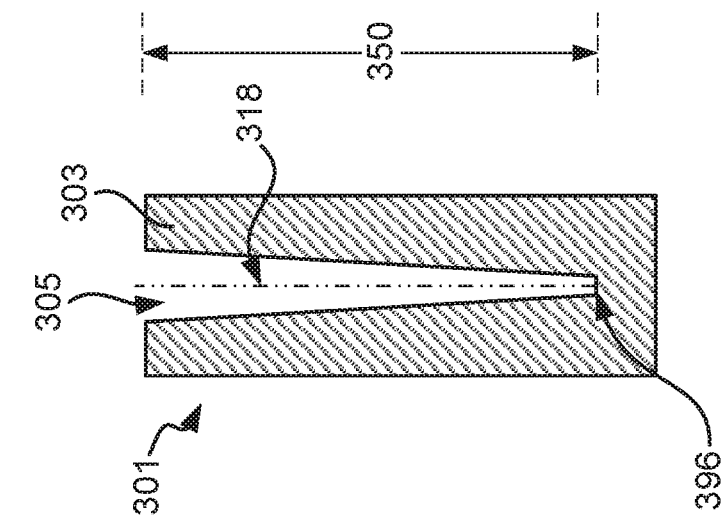
Figure 3H:
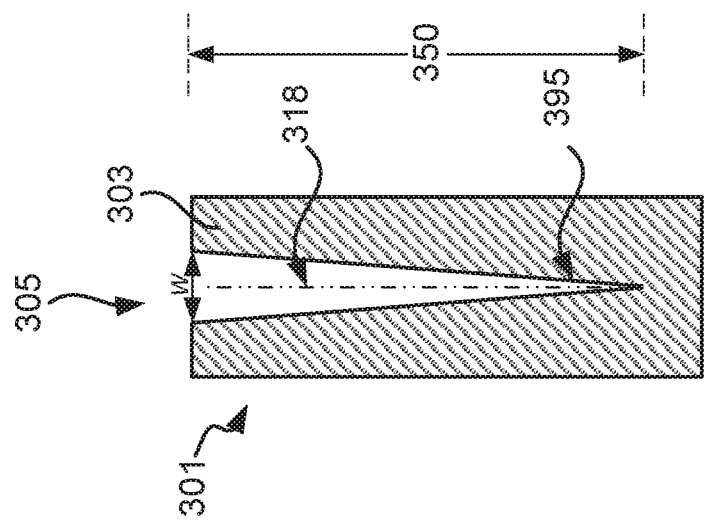

FIG. 3H provides an example of a cross-sectional view of a V-shaped feature. FIG. 3H includes feature 301 to be filled with tungsten, including a feature hole 305 in a substrate 303. The hole has a dimension near the opening (e.g., an opening diameter or a line width w, which may be between about 10 nm and about 20 nm, or about 15 nm). The width is measured by the distance between sidewalls of a feature. The width may vary from the top of the feature at the feature opening (the opening diameter or line width w) to the bottom of the feature. The feature hole 305 is characterized in part by an axis 318. The V-shaped feature 301 includes a depth 350 which may be between about 80 nm and about 120 nm, or about 100 nm. In various embodiments, the sidewalls meet at a point 395 at the bottom of the feature or in some embodiments, the bottom of the feature plateaus to a flat bottom surface, which may have a distance from one sidewall to the other of between about 0.1 w and about 0.9 w, or as a percentage of line width w at the opening of about 10% of the width w to about 90% of the width w. Features may have an aspect ratio of between 2:1 and about 10:1, or between about 6:1 and about 8:1, or about 6:1, or about 8:1. The pitch of the lines may be between about 20 nm and about 40 nm. The bottom of the feature, which is characterized as the region in the bottom 50% to 70% of the depth of the feature, may have a width between sidewalls of between 0 nm and about 20 nm.

FIG. 3I provides another example of a cross-sectional view of a V-shaped feature. The V-shaped feature as described herein refers to features having narrowing width from the top field level of the substrate to the bottom of the feature. FIG. 3I includes feature 301 to be filled with a metal such as tungsten, including a feature hole 305 in a substrate 303. The hole has a dimension near the opening (e.g., an opening diameter or a line width w, which may be between about 10 nm and about 20 nm, or about 15 nm). The bottom of the feature 396 has a width narrower than that of w. For example, the bottom of the feature 396 may have a width between 1% and 90% of the width w, or between 1% and 50%, or between 10% and 20% of the width w.

Multiple V-shaped features are present on a substrate in various disclosed embodiments, such as shown in FIG. 2B. Multiple features on a substrate are defined as adjacent features having a distance no larger than between 20 nm and 40 nm of each other. In various embodiments, such multiple features includes all V-shaped features, which may have a shape such as depicted in FIG. 3H or 3I.

Examples of feature fill for horizontally-oriented and vertically-oriented features are described below. It should be noted that the examples applicable to both horizontally-oriented or vertically-oriented features. Moreover, it should also be noted that in the description below, the term "lateral" may be used to refer to a direction generally orthogonal to the feature axis and the term "vertical" to refer to a direction generally along the feature axis.

While the description below focuses on tungsten feature fill, aspects of the disclosure may also be implemented in filling features with other materials. For example, feature fill using one or more techniques described herein may be used to fill features with other materials, including Mo, Co, and Ru. Further, it can be used to fill features with any material that undergoes grain growth in vapor deposition processes.

Some embodiments involve deposition of an amorphous layer during fill of adjacent trenches. The amorphous layer may be deposited from 10 Å to 1 nm thick in certain embodiments. According to various embodiments, the amorphous is layer is deposited conformally in the feature. The amorphous layer interrupts the zipping mechanism described above and mitigates stress propagation towards dielectric in the feature.

The amorphous film includes the metal (e.g., W, Mo, Co, Ru, etc.) and some amount of impurities. Examples of such impurities include boron (B), nitrogen (N), carbon (C), silicon (Si), and germanium (Ge). The presence of the impurities makes the metal film amorphous and prevents the zipping mechanism and/or prevents stress propagation from the bulk layer to the dielectric. Example impurity levels include between 5% and 50% atomic with the balance of the film being the metal. In some embodiments, the amorphous layer is at least 50 atomic % metal, at least 60 atomic %, at least 70 atomic %, at least 80 atomic %, or at least 90 atomic % metal.

The amorphous film may include a mixture of the metal and a metal compound, for example, an amorphous layer may have a mixture tungsten (W) and tungsten nitride (WN), with the total amount of W in the amorphous layer being at least 50 atomic % and the total amount of N in the amorphous layer being between 5 atomic % and 50 atomic %. In another example, the amorphous film is a mixture of W and B and/or N, with the total amount of B and/or N in the film being between 5 atomic % and 50 atomic %.

Figure 4A:
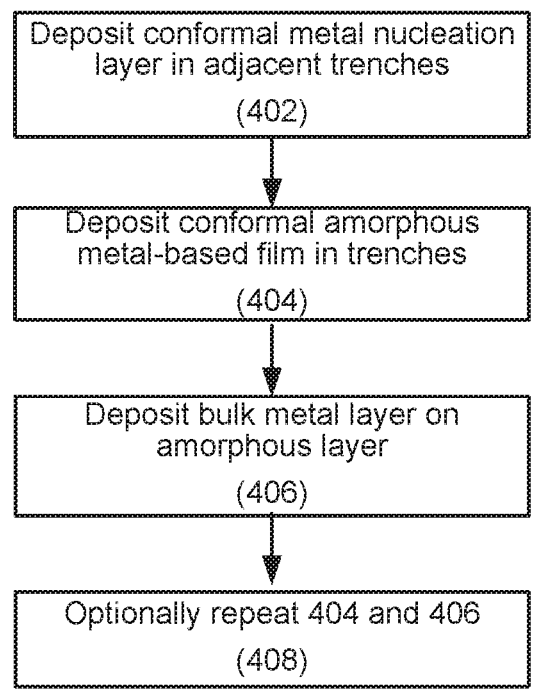
FIGS. 4A-4C are process flow diagrams depicting operations for methods performed in accordance with certain disclosed embodiments.

The amorphous layer may be deposited at various stages of the fill process according to different embodiments. FIG. 4A provides an example of a process flow for filling adjacent trenches. The process begins with depositing a conformal nucleation layer in the adjacent trenches (402). The conformal amorphous metal-based film is then deposited in trenches. (404). In this example, the amorphous layer may be relatively thin, e.g., 10 Å-50 Å, 10 Å-40 Å, or 10 Å-20 Å. Next, a bulk metal layer is deposited on the amorphous layer (406). In some embodiments, the bulk metal layer may be deposited to fill the trenches. In other embodiments, the operations 404 and 406 may be repeated one or more times to fill the trench (408). Operations 404 and 406 may be advantageously repeated if the zipping mechanism would occur as conformal bulk deposition is performed. The bulk layer may be a high purity layer, e.g., having at least 97% or 99% atomic purity of the elemental metal.

In the example of FIG. 4A, one or more anneal operations may be performed to reduce resistivity of the amorphous layer. According to various embodiments, a thermal anneal may be performed only after the feature is filled (e.g., after operation 408, if performed), optionally after the deposition of the amorphous layer (e.g., between operations 404 and 406), or optionally after deposition of some or all of the bulk layer (e.g., during or after operations 406).

The process described with respect to FIG. 4A may be modified according to various embodiments. In some embodiments, operation 406 is not performed. For example, in some embodiments, an amorphous layer is used to fill the entire feature, such that only operation 404 is performed. In some embodiments, a nucleation layer is deposited followed by an amorphous layer to fill the features such that only operations 402 and 404 are performed. Still further, in some embodiments, a nucleation layer is not deposited with only operations 404 and 406 (and optionally 408) performed.

Figure 4B:
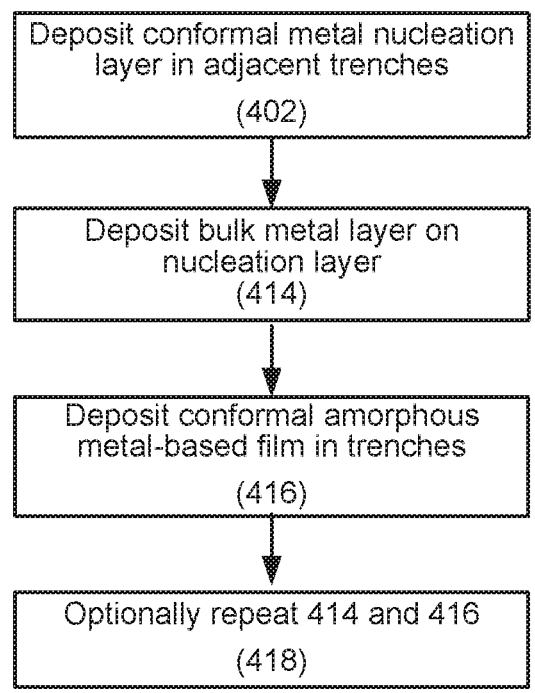

FIG. 4B provides another example of a process flow for filling adjacent trenches. The process begins with depositing a conformal nucleation layer in the adjacent trenches (402) as in the example of FIG. 4A. However, in this example, the bulk metal layer is deposited (414), on the underlying layer (e.g., the nucleation layer). This is followed by deposition of the amorphous layer (416). Operations 414 and 416 may be repeated one or more times to fill the trench (418). The bulk layer may be a high purity layer, e.g., having at least 97% or 99% atomic purity of the elemental metal. In some embodiments, after an initial instance of operation 416, deposition of the amorphous layer is halted, and operation 414 is repeated to complete fill of the trench.

In the example of FIG. 4B, one or more anneal operations may be performed to reduce resistivity of the amorphous layer. According to various embodiments, a thermal anneal may be performed only after the feature is filled (e.g., after operation 418, if performed), optionally after the deposition of the amorphous layer (e.g., after operation 416).

The process described with respect to FIG. 4B may be modified according to various embodiments. In some embodiments, a nucleation layer is not deposited with only operations 414 and 416 performed. In some embodiments, in which deposition of bulk metal occurs after deposition of the amorphous layer, a treatment to remove or less an inhibition effect may be performed prior to bulk deposition. Such treatments can involve soak step of one or more of reducing agent (e.g., diborane and/or silane and/or hydrogen) and a metal precursor. In some embodiments, deposition of a bulk layer on an amorphous layer may be preceded by nucleation layer deposition. For example, one sequence may involve metal nucleation/metal bulk/amorphous layer/metal nucleation/bulk metal.

Figure 5A:
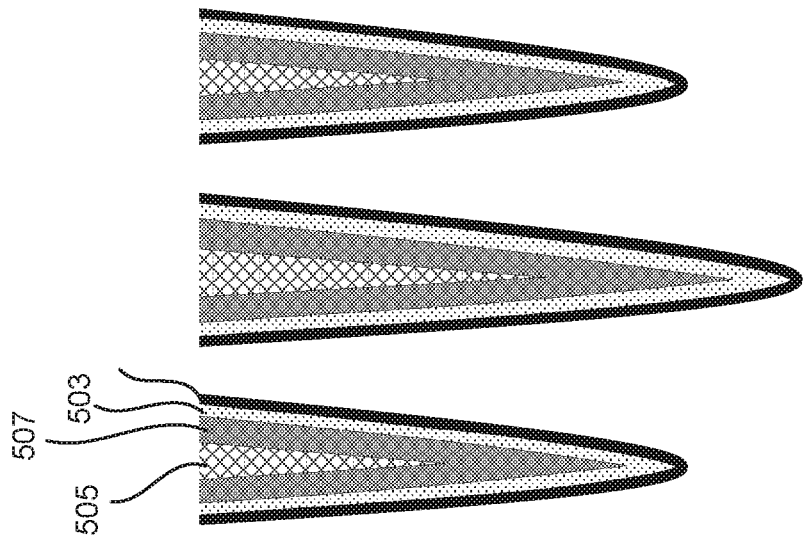
FIGS. 5A-5C are schematic illustrations of various operations during feature fill according to certain embodiments.
Figure 5B:
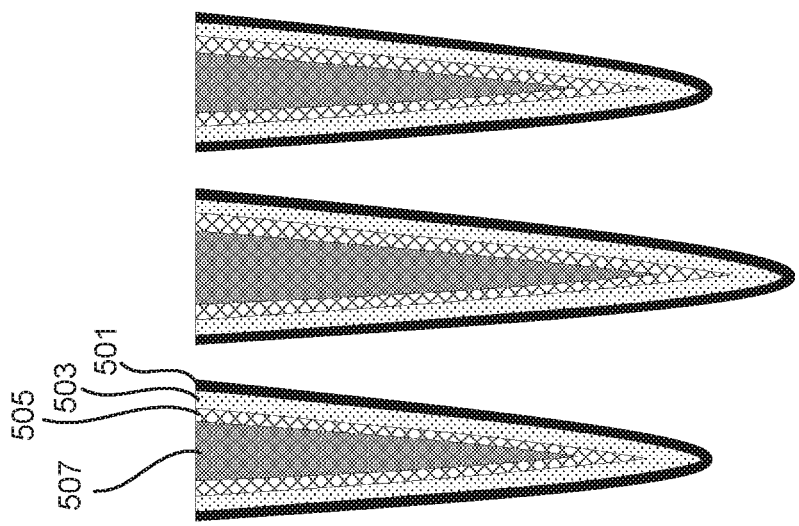

FIGS. 5A and 5B show schematic examples of adjacent trenches filled by methods according to FIGS. 4A and 4B, respectively. In FIG. 5A, the trenches are lined with a barrier layer 501, e.g. TiN, and include a conformal nucleation layer 505 (e.g., a 2 nm thick nucleation layer), a conformal amorphous layer 503 (e.g., about 10 nm), and filled with a bulk layer 507.

In FIG. 5B, the trenches are lined with a barrier layer 501, e.g. TIN, and include a conformal nucleation layer 503 (e.g., a 2 nm thick nucleation layer), a conformal bulk layer 507, and filled with an amorphous layer 505. The method of FIG. 4B mitigates the zipping effect during seam closure, while the method of FIG. 4A may be understood to prevent stress migration from the bulk layer to the nucleation layer to the barrier layer and dielectric by interposing the amorphous layer between the bulk layer and the dielectric. Both effects may be advantageously observed in embodiments in which operations 408 and 418 are performed.

While the presence of the amorphous film mitigates line bending, it is a higher resistivity film than the bulk metal film. Line bending mitigation and resistivity can be tuned appropriately by controlling the thickness of each of the films as well as the amount of impurity in the amorphous film. In the method of FIG. 4B, the amorphous layer may be deposited at or a point at which the zipping up mechanism would otherwise occur to prevent it from occurring. This may be determined experimentally, by modeling, or theoretically. In the method of FIG. 4A, the thickness of the middle amorphous film may be controlled to mitigate resistivity increase.

A reduction in line bending from using a fill process including an amorphous film was observed from two processes were used to fill adjacent trenches to form lines. Process A is a reference (no amorphous film) process.
Process A: nucleation+W-CVD (WF$_6$/H$_2$ CVD)
Process B: nucleation+amorphous film deposited from WF$_6$ and NH$_3$.
Temperature was about 300° C. and chamber pressure around 10 Torr.

| Film | Line Bending |
|---|---|
| Nucleation + CVD-W | >3 nm |
| Nucleation + NH3/WF6 based W film | ~1.4 nm |

In the embodiments described above, a layer including a metal and one or more impurities (e.g., nitrogen, boron, etc.) is described as being amorphous. In other embodiments, layer having impurities but that is not necessarily amorphous may be used in the manner described above for the amorphous layer.

In some embodiments, an entire feature may be filled with a layer including impurities. For example, a tungsten nitride (WN) film may be used as the main conductor in a trench. Other examples of such layers include other metal nitrides including titanium nitride (TiN) and tantalum nitride (TaN).

Figure 4C:
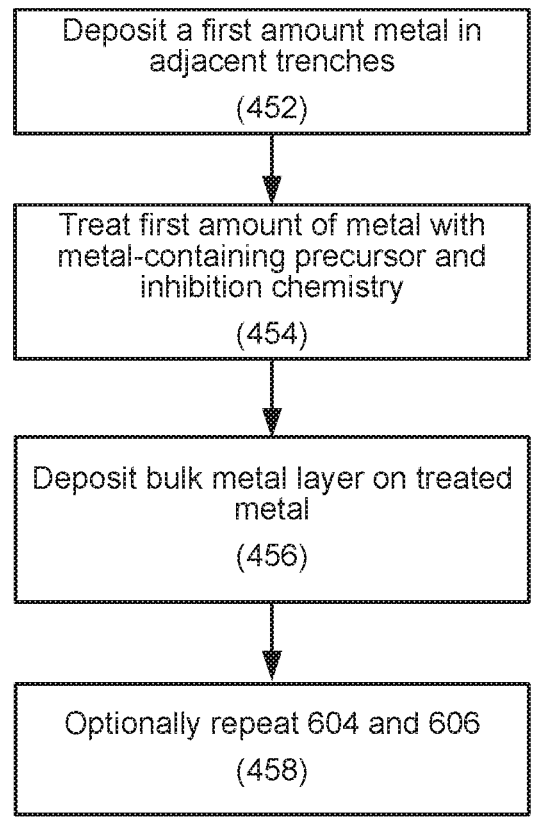

In certain embodiments, the methods involve conformal treating the feature using a metal-containing precursor and an inhibition chemistry prior to deposition of a bulk layer. FIG. 4C provides an example of a process flow for filling adjacent trenches. The process begins with depositing a first amount of metal the adjacent trenches (452). This may be a conformal nucleation layer in some embodiments or may include a nucleation layer and some amount of a bulk layer. Thus, after this stage the features have a generally conformal layer of metal lining the sidewalls and bottom of the feature. In one example, a 15 nm feature is lined with a 2 nm nucleation layer. Next, the deposited layer is treated conformally with a metal-containing precursor and an inhibition chemistry. (454) In one example, the feature is exposed to a tungsten-containing precursor and ammonia (NH$_3$). The treatment in block 454 may involve depositing a film and/or adsorbing species of the tungsten-containing precursor and inhibition chemistry. In certain embodiments, the treatment is performed such that it is conformal but discontinuous. For example, a discontinuous film may be deposited throughout the depth of the feature. In another example, tungsten-containing species and nitrogen-containing species are adsorbed non-uniformly throughout the depth of the feature. This has the effect of providing non-uniform passivation throughout the depth of the feature, such that in the subsequent bulk layer process, a film may be deposited conformally but with increased roughness.

Next, a bulk metal layer is deposited on the treated metal (456). In some embodiments, the bulk metal layer may be deposited to fill the trenches. In other embodiments, the operations 454 and 456 may be repeated one or more times to fill the trench (458). Operations 454 and 456 may be advantageously repeated if the zipping mechanism would occur as conformal bulk deposition is performed. The bulk layer may be a high purity layer, e.g., having at least 97% or 99% atomic purity of the elemental metal.

In the example of FIG. 4C, one or more anneal operations may be performed to reduce resistivity of the amorphous layer. According to various embodiments, a thermal anneal may be performed only after the feature is filled (e.g., after operation 458, if performed), optionally after the treatment (e.g., between operations 454 and 456), or optionally after deposition of some or all of the bulk layer (e.g., during or after operation 456).

The process described with respect to FIG. 4C may be modified according to various embodiments. For example, in some embodiments, operation 452 is not performed with only operations 454 and 456 (and optionally 458) performed. This is may be appropriate in some embodiments if the feature is provided with a liner layer (e.g., WCN) that can be treated as described above.

In some embodiments, the treatment operation may involve only an inhibition chemistry that is non-uniformly adsorbed throughout the feature and/or non-uniformly reacts with the underlying metal to form a discontinuously passivated surface throughout the depth of the feature.

Figure 5C:
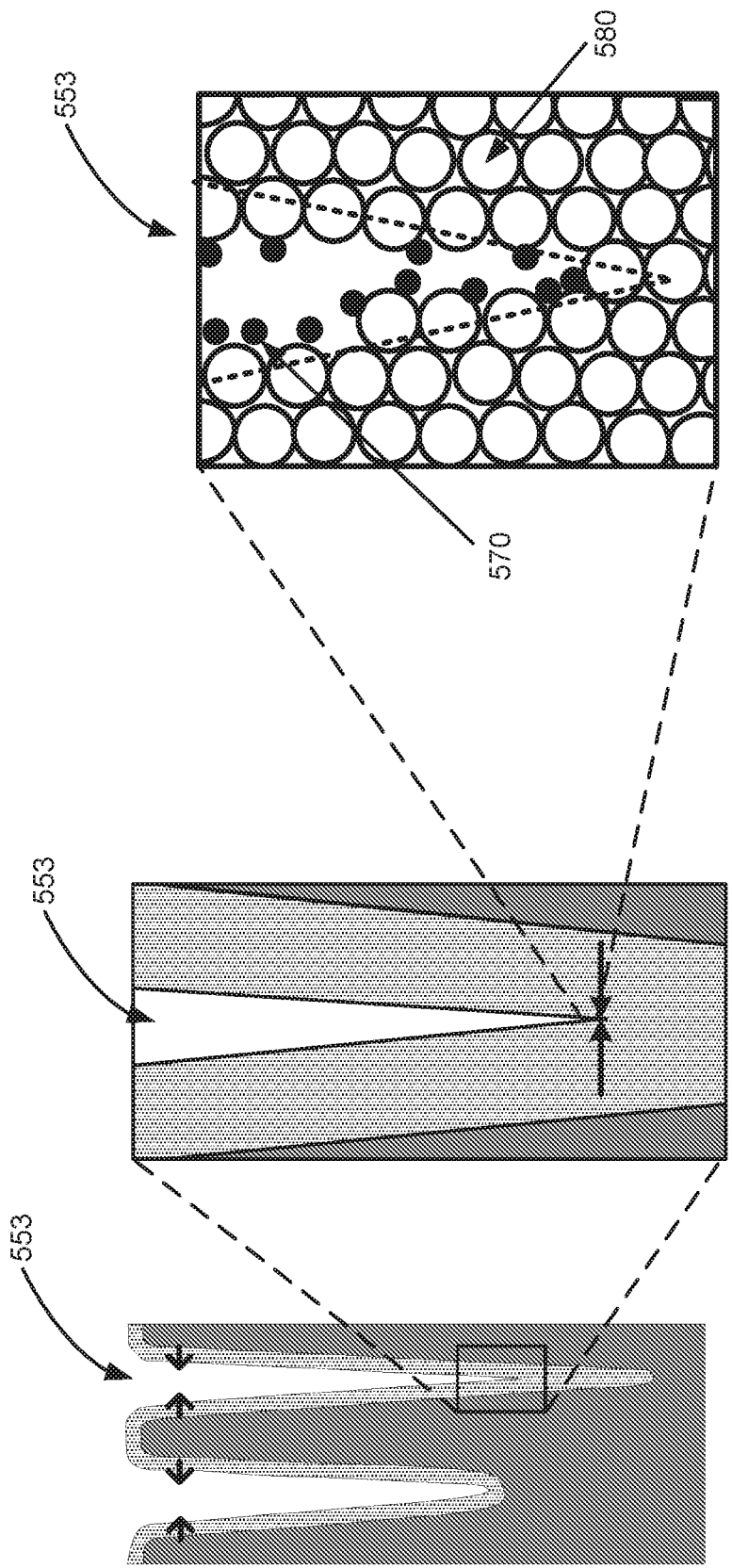

FIG. 5C shows an example of a substrate having a V-shaped feature 553 where species 570 on the surface of the deposited tungsten 580 along the sidewalls of the feature 553 prevents tungsten-tungsten bonding, thereby reducing line bending. The species are discontinuously adsorbed throughout the feature.

Disclosed embodiments are suitable for reducing line bending. Line bending analysis may be performed by measuring the line width and roughness of the trenches filled with tungsten or other metal. The line bending analysis involves imaging the metal at the top of the device opening with plan-view microscopy and measuring the metal width at multiple points on multiple lines. For each line, the line width is measured across 100 points. From each line, one then calculates the average line width and the variation of the line width, which may also be defined as roughness. The "line width mean" is the average of all the individual lines' average line width measured during analysis.

For line bending, two main metrics are defined as follows: (i) line-to-line (LTL) variation is the standard deviation of the average line widths, thereby capturing the variation of line width changes across different lines on the image, and (ii) line width roughness (LWR) is the average of line roughness (variation of line width within each line) from all the measured lines, thereby capturing the average line width variation within single lines. These two metrics, LTL and LWR are combined into single variation metric, a total, as determined by $\sigma=(\sigma_1^2+\sigma_2^2)^{1/2}$. Furthermore, LTL and a total are normalized with respect to line width mean, described as LTL % and a total %.

In various embodiments, the methods result in substrates where total variance is less than about 5 nm, or less than about 1.5 nm, or in percentage, less than about 7.2%, where total variance percentage is calculated by normalizing total variance by the average line width.

In any of the fill processes described herein, inhibition treatments may be preferentially applied to the top of the feature to facilitate fill improvement. Such inhibition treatments can involve thermal or plasma treatments using an inhibition chemistry. For example, an N$_2$ plasma or NH$_3$ thermal treatment can be used to inhibit nucleation at the top of a feature at any point during the fill process.

An inhibition chemistry refers to an atom, compound, or other species that interacts with the surface to inhibit subsequent nucleation of the metal. Nitrogen can inhibit tungsten nucleation, for example, and can be delivered thermally (e.g., in ammonia) or in a plasma (e.g., N$_2$ plasma).

Amorphous Layer Deposition

Figure 6:
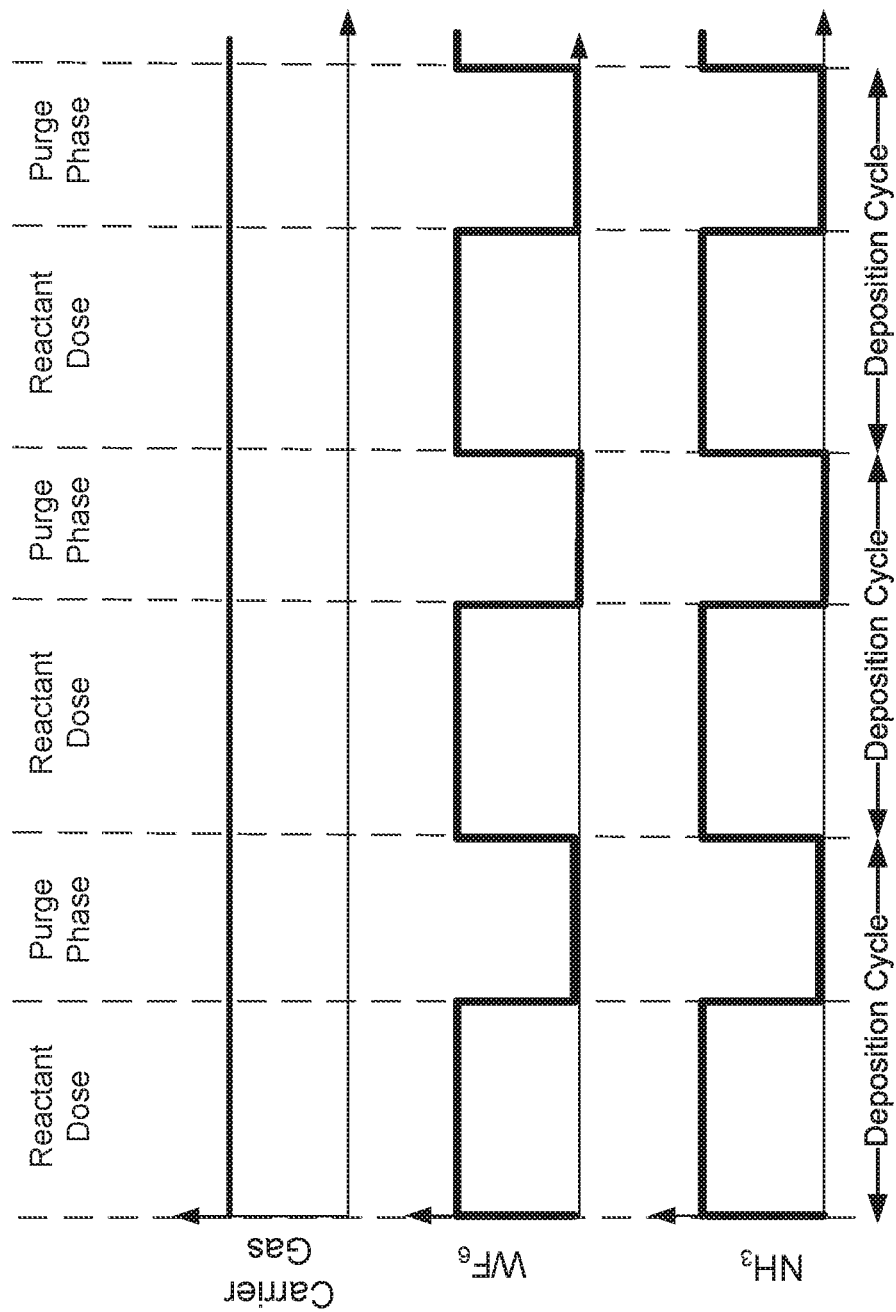
FIGS. 6-10 are timing sequence diagrams showing example cycles in various methods in accordance with certain disclosed embodiments.
Figure 7:
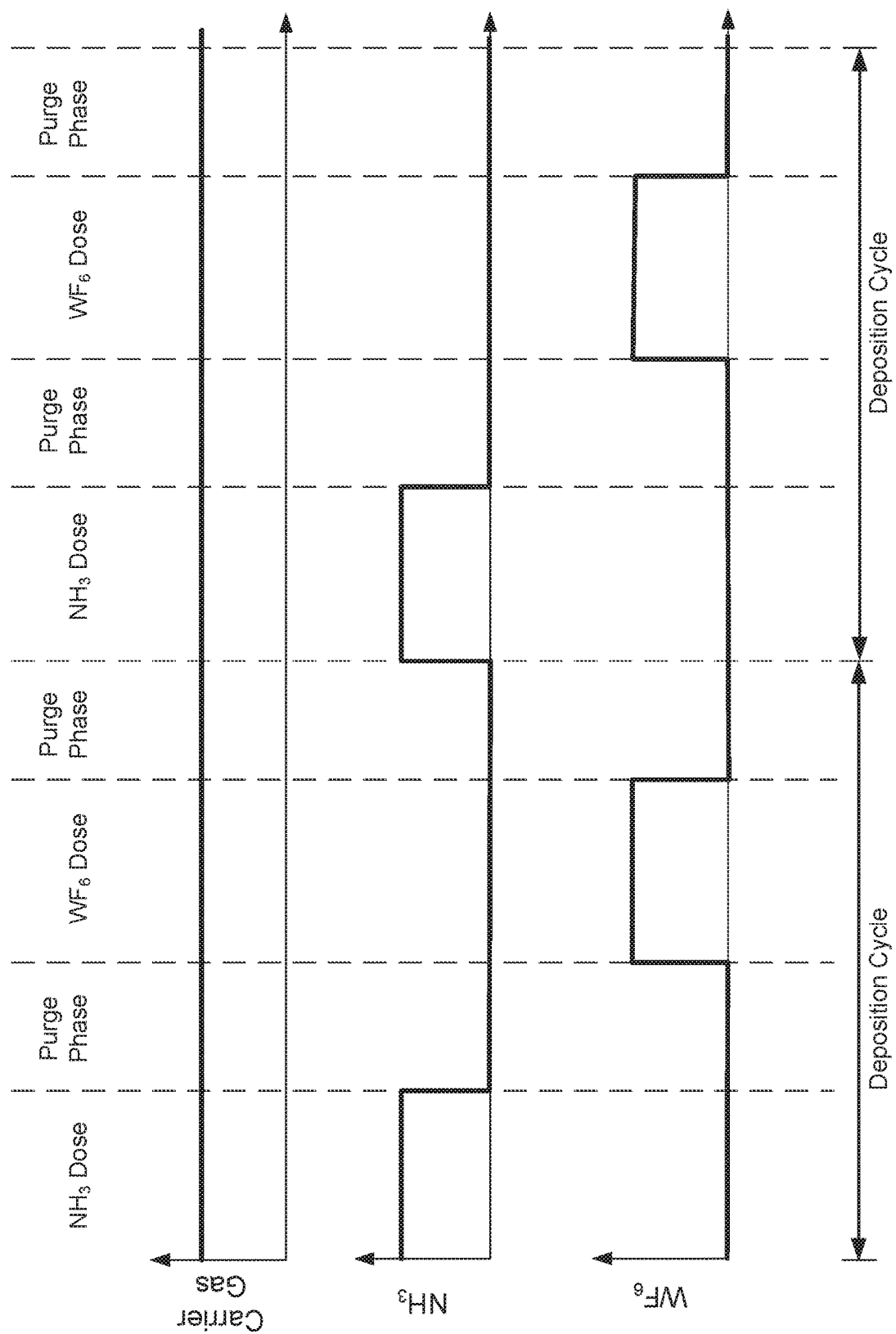

Deposition of an amorphous layer as described above with respect to FIGS. 4A and 4B may be performed using CVD or ALD techniques. FIGS. 6 and 7 provide timing sequence diagram depicting examples cycles of depositing an amorphous W-based layer from a tungsten-containing precursor $WF_6$ and a reducing agent $NH_3$. In FIG. 6, the reactants are co-flowed in doses with purges between sequential doses. In FIG. 7, the reactants are alternated with purges between each reactant.

Reactant conditions during deposition of the amorphous layer are such that an impurity is incorporated into the film. This is unlike nucleation layer and bulk layer deposition in which high purity metal films may be deposited. In some embodiments, such as in FIGS. 6 and 7, the impurity is supplied by the reducing agent. In those examples, nitrogen is incorporated from the $NH_3$. Likewise, boron may be incorporated from diborane reducing agent.

In other examples, an impurity may be in the metal-containing precursor or supplied separate from the metal-containing precursor and a reducing agent. For example, $N_2$ may be used to supply nitrogen to form an amorphous film in a $WF_6/H_2$ reaction.

Examples of such reducing agents include boron-containing, silicon-containing, and germanium-containing reducing agents. Examples of boron-containing reducing agents include boranes such as $B_nH_{n+4}$, $B_nH_{n+6}$, $B_nH_{n+8}$, $BnH_m$, where n is an integer from 1 to 10, and m is a different integer than n. In particular examples, diborane may be employed. Other boron-containing compounds may also be used, e.g., alkyl boranes, alkyl boron, aminoboranes $(CH_3)_2NB(CH_2)_2$, and carboranes such as $C_2B_nH_{n+2}$. Examples of silicon-containing compounds include silanes such as $SiH_4$ and $Si_2H_6$. Examples of germanium-containing compounds include germanes, such as $Ge_nH_{n+4}$, $Ge_nH_{n+6}$, $Ge_nH_{n+8}$, and $Ge_nH_m$, where n is an integer from 1 to 10, and n is a different integer than m. Other germanium-containing compounds may also be used, e.g., alkyl germanes, alkyl germanium, aminogermanes and carbogermanes. Examples of nitrogen-containing reducing agents $NH_3$, and $N_2H_4$. Examples of carbon-containing reactants include $CH_4$ and $C_2H_2$.

Depending on the reactants, the temperature may be relatively high to permit incorporation of the impurity. The amount of reducing agent or other impurity carrier may be high to result in incorporation.

Amorphous film deposition processes can involve exposing the substrate to more impurity-containing reactant than metal-containing reactant to allow impurity incorporation into the film. In some embodiments, an ALD process involves a ratio of the number of impurity-containing reactant pulses to metal-containing reactant pulses of at least 2:1. The ratio can be at least 3:1, 4:1 or higher according to various embodiments. In the processes described herein, a pulse can be a single injection of gas or several short sequential injections. In some embodiments, the processes involve a ratio of the number of impurity-containing reactant injections to metal-containing reactant injections of at least 2:1, 3:1 or higher.

In some embodiments, the relative flow rates of the reactants may also be varied to modulate the concentrations of metal and impurity. Example flow rates can range from about 60 sccm to about 300 sccm for a 300 mm wafer, with flow rates scaling linearly with area. Dosage times can also be varied, with a greater number of short pulses of the impurity-containing reactant providing more efficient incorporation than fewer, longer pulses. Moreover, in some embodiments, a relatively long purge time follows at least the pulses of the impurity-containing reactant.

In some embodiments, the amount of impurity may be limited to improve resistivity. For example, this can involve a ratio of number of impurity-containing reactant pulses to metal-containing reactant pulses of less than 2:1, or even less than 1:1. Flow rate ratios can be similarly modulated as can exposure times. Total exposure times may be such that the exposure time for a metal-containing gas is greater than the impurity-containing reactant gas.

In some embodiments, the amount of impurity may be varied throughout the deposition of the amorphous film. For example, the amount of $NH_3$ may be increased at the point where the zipping up mechanism is observed, then decreased. In this manner, the amount of impurity may be varied. Flow rates and/or exposure times may be varied.

Treatment Using Metal-Containing Precursor and Inhibition Chemistry

In some embodiments, the methods includes a treatment to inhibit metal nucleation at least at sites along the sidewalls of the features. In some implementations, inhibition can involve a chemical reaction between inhibition species and the metal-containing precursor or feature surface to form small islands of a compound material such as tungsten nitride (WN) or tungsten carbide (WC). In some implementations, inhibition can involve a surface effect such as adsorption that passivates the surface without forming a layer of a compound material. The metal-containing precursor adsorb at sites that may provide seeds metal nucleation in subsequent deposition operations.

The inhibition chemistry may be a nitrogen-containing compound such as $N_2$ or $NH_3$. Other chemistries that may be used for inhibition of tungsten and other metal surfaces include oxygen-based and hydrocarbon-based chemistries. For example, molecular oxygen or methane may be introduced to a plasma generator. An inert component such as argon, xenon, or krypton may be used as a carrier gas. In some implementations, no other non-inert components are present in the gas from which the plasma is generated except in trace amounts. In some implementations, inhibition chemistries may be nitrogen-containing, hydrogen-containing, oxygen-containing, and/or carbon-containing, with one or more additional reactive species present in the plasma.

Operation 454 in FIG. 4C may be a thermal or plasma-assisted process. If thermal, the metal-containing precursor may be flowed with the inhibition chemistry or they may be introduced to the feature sequentially. If plasma-assisted, the plasma may be ignited while the inhibition chemistry is in the chamber. A co-reactant for the metal-containing precursor (e.g., $H_2$) may or may not be flowed.

Figure 8:
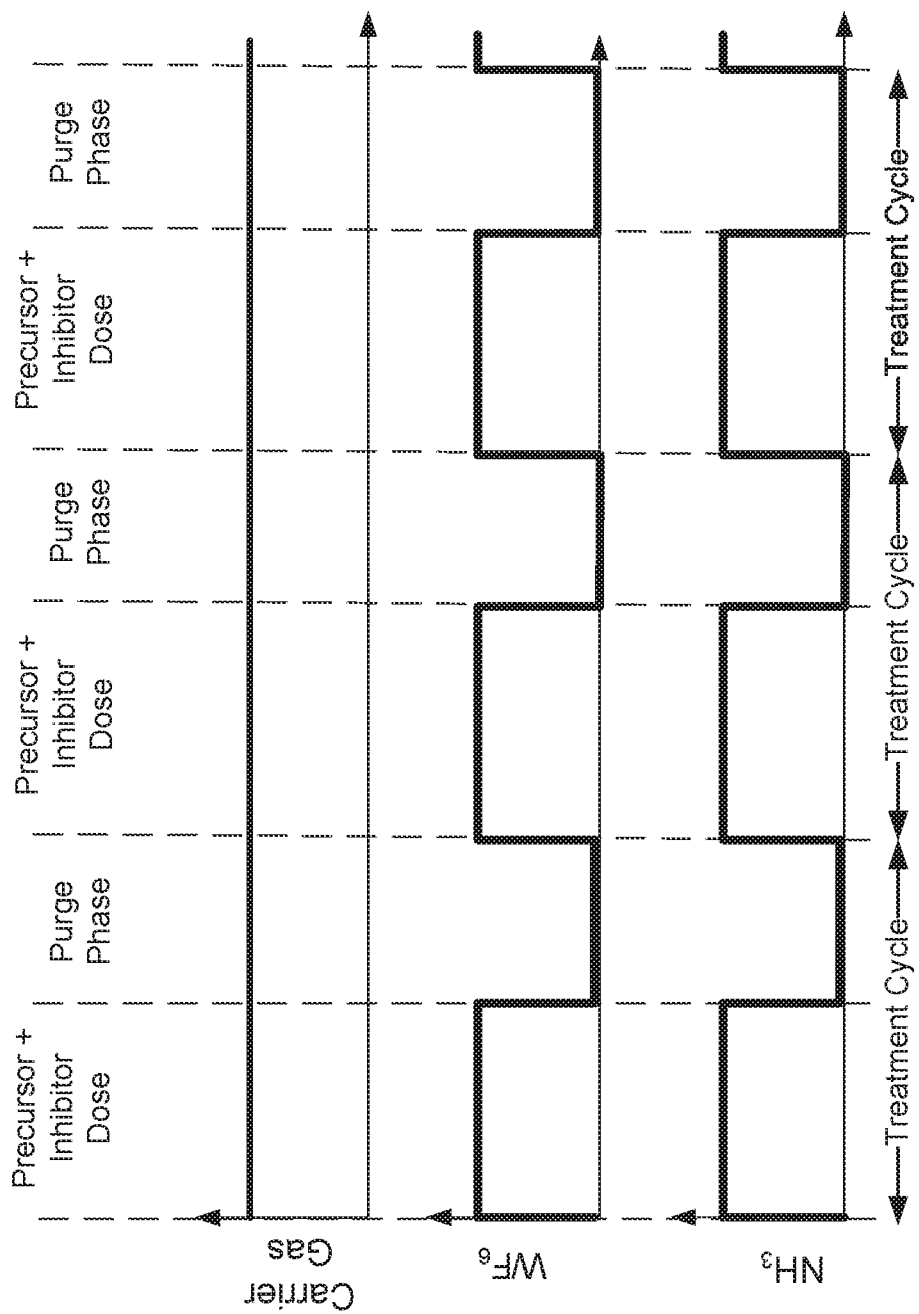
Figure 9:
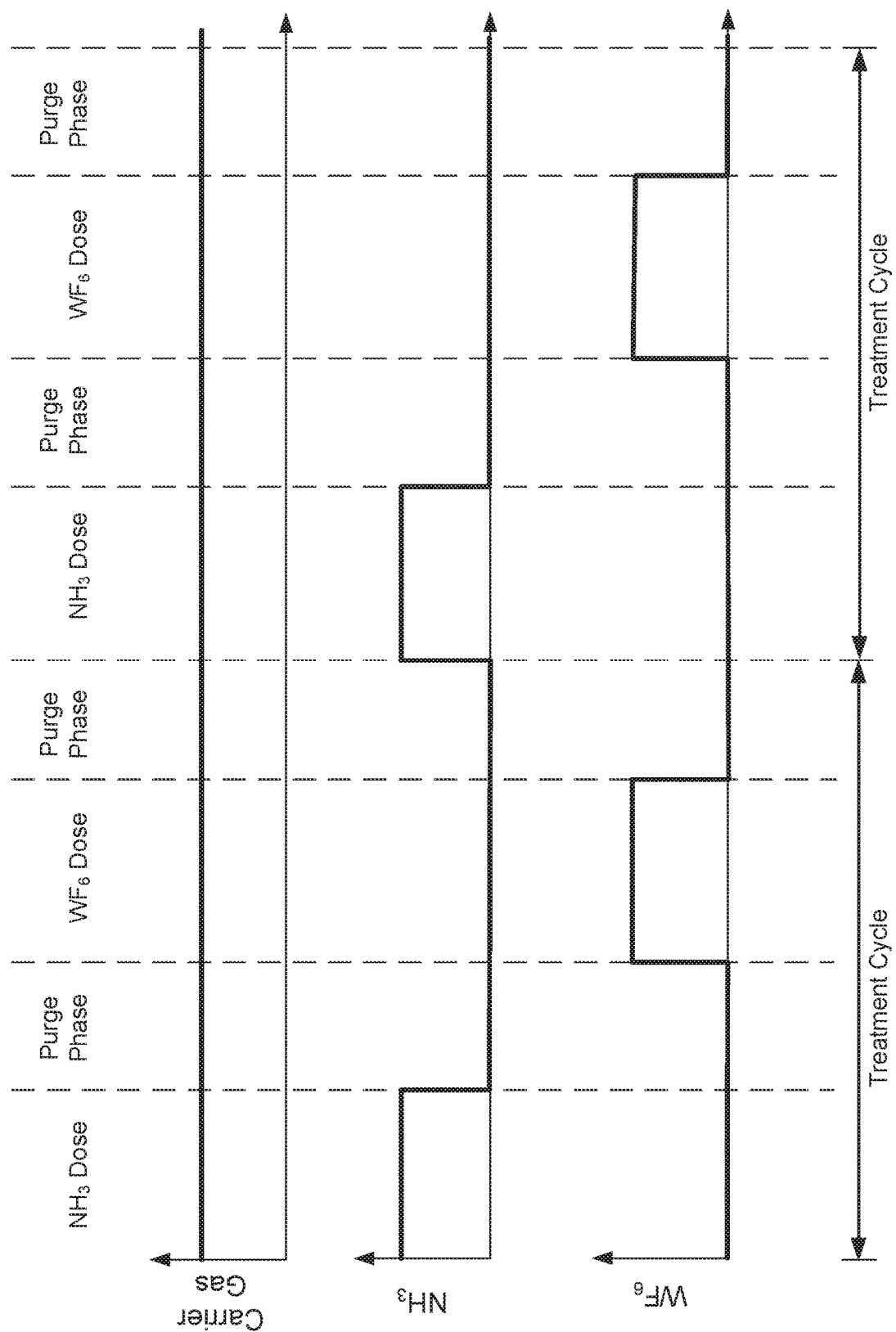
Figure 10:
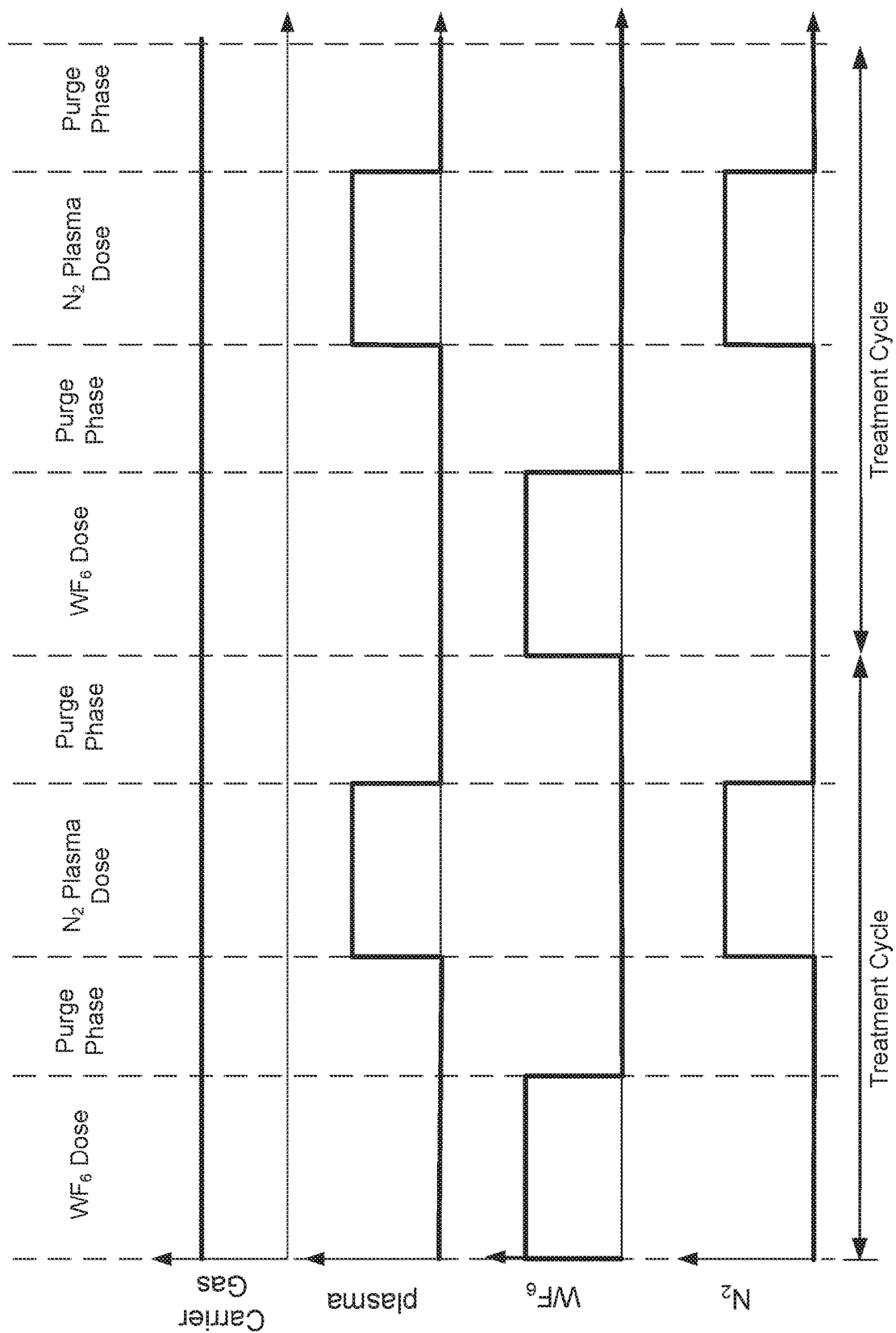

FIGS. 8-10 provide timing sequence diagram depicting examples cycles of treating the surface using a tungsten-containing precursor $WF_6$ and a reducing agent $NH_3$. In these Figures, $WF_6$ is shown as a metal-containing precursor, $NH_3$ or $N_2$ are shown as inhibition chemistries, and $H_2$ as a co-reactant. However, it will be understood that the examples are applicable to other metal-containing precursors (e.g., $WCl_x$, $MoCl_4$, etc.), other inhibition chemistries, and other co-reactants may be used.

In FIG. 8, the metal-containing precursor and inhibition chemistry are co-flowed in doses with purges between sequential doses. Alternatively, the compounds may be co-flowed in one dose without purging until the treatment is complete. In FIG. 9, the metal-containing precursor and inhibition chemistry are alternated with purges between each reactant. In FIGS. 8-10 a carrier gas is shown. This may be for example argon (Ar) or any other inert gas. In some embodiments, a carrier gas may not be used and/or may be used only for certain flows. The treatment cycles may begin with either the inhibition chemistry or the metal-containing precursor. The metal-containing precursor or inhibition chemistry may be introduced with a compound such as reducing agent. In the examples of FIGS. 8 and 9 no additional reducing agent is used, though the hydrogen in the ammonia may act as one. The examples in FIGS. 8 and 9 are thermal processes. FIG. 10 shows an example a plasma-assisted process. Here, the metal-containing precursor dose in alternated with a plasma generated from $N_2$ gas. Either a remote or an in-situ plasma generator may be used. In other embodiments, the metal-containing precursor and the inhibition chemistry may be introduced together or sequentially without plasma with a plasma generated from an inert gas (e.g., Ar) then applied.

As indicated above, the treatment is conformal, while being discontinuous. Process parameters that may be adjusted to achieve this include exposure time, number of cycles, reactant concentration, and chamber pressure. Temperature can also be used to achieve conformality and discontinuity. Lower temperatures may allow the compounds to diffuse to the bottom of the feature (rather than reacting at the top) and also allow the treatment to be stopped while the film and/or adsorbed species are discontinuously deposited and/or adsorbed.

For plasma-based processes, tuning an inhibition profile can involve appropriately controlling an inhibition chemistry, substrate bias power, plasma power, process pressure, exposure time, and other process parameters. For in situ plasma processes (or other processes in which ionic species are present), a bias can be applied to the substrate. Substrate bias can, in some implementations, significantly affect an inhibition profile, with increasing bias power resulting in active species deeper within a vertically-oriented feature. Inhibition chemistry can also be used to tune an inhibition profile, with different ratios of active inhibiting species used. For example, for inhibition of W and other metal surfaces, nitrogen may have a stronger inhibiting effect than hydrogen; adjusting the ratio of $N_2$ and $H_2$ gas in a forming gas-based plasma can be used to tune a profile. The plasma power may also be used to tune an inhibition profile, with different ratios of active species tuned by plasma power.

Process pressure can be used to tune a profile, as pressure can cause more recombination (deactivating active species) as well as pushing active species further into a feature. Process time may also be used to tune inhibition profiles, with increasing treatment time causing inhibition deeper into a feature.

In some implementations, inhibition rates depend on various components' concentrations at different locations inside the feature. For conformal treatment, high amounts of inhibition species may be supplied (e.g., by increasing number of cycles, dose time, flow rate, and concentration) to avoid consumption of species at the feature opening. In addition to the overall inhibition concentration variations inside features, inhibition may be influenced by relative concentrations of different inhibition species throughout the feature. These relative concentrations in turn can depend on relative dynamics of dissociation and recombination processes of the inhibition species. An initial inhibition material, such as molecular nitrogen, can be passed through a remote plasma generator and/or subjected to an in-situ plasma to generate activated species (e.g., atomic nitrogen, nitrogen ions). However, activated species may recombine into less active recombined species (e.g., nitrogen molecules) and/or react with W, WN, TiN, or other feature surfaces along their diffusion paths. As such, different parts of the feature may be exposed to different concentrations of different inhibition materials, e.g., an initial inhibition gas, activated inhibition species, and recombined inhibition species. Activated species are generally more reactive than initial inhibition gases and recombined inhibition species. Furthermore, in some cases, the activated species may be less sensitive to temperature variations than the recombined species. Process conditions may be controlled in such a way that inhibition is predominantly attributed to non-activated species (e.g., as in a non-plasma, thermal process).

The timing sequence diagrams are similar to those for deposition described. However, as described above, at most only a discontinuous layer is deposited. To limit the treatment accordingly, one or more of temperature, dose time, and total exposure time can be controlled.

Nucleation Layer Deposition

Nucleation layers deposited in accordance with certain disclosed embodiments by alternating between a metal-containing precursor and a reducing agent, such as silane ($SiH_4$), disilane ($Si_2H_6$), trisilane ($Si_3H_8$), germane ($GeH_4$), or diborane ($B_2H_6$). In some embodiments, the nucleation layer is deposited by exposing the substrate to alternating pulses of a tungsten-containing precursor and silane. In some embodiments, the nucleation layer is deposited by exposing the substrate to alternating pulses of a tungsten-containing precursor and diborane. In some embodiments, the nucleation layer is deposited by exposing the substrate to alternating pulses of a tungsten-containing precursor and silane, then exposing the substrate to alternating pulses of a tungsten-containing precursor and diborane. In some embodiments, the nucleation layer is deposited by exposing the substrate to alternating pulses of a tungsten-containing precursor and diborane, then exposing the substrate to alternating pulses of a tungsten-containing precursor and silane. In some embodiments, the nucleation layer is deposited by exposing the substrate to alternating pulses of a tungsten-containing precursor and silane, then exposing the substrate to alternating pulses of a tungsten-containing precursor and diborane, then exposing the substrate to alternating pulses of a tungsten-containing precursor and silane. In some embodiments, the nucleation layer is deposited by exposing the substrate to alternating pulses of a tungsten-containing precursor and diborane, then exposing the substrate to alternating pulses of a tungsten-containing precursor and silane, then exposing the substrate to alternating pulses of a tungsten-containing precursor and diborane. In any of the disclosed embodiments, a chamber housing the substrate may be purged between one or more dose operations for depositing a nucleation layer. Purging may be performed by flowing an inert gas such as argon into the chamber. Any suitable inert gas may be used for purging. For example, in some embodiments, a substrate may be exposed to a pulse of tungsten-containing precursor, then the chamber may be purged, then the substrate may be exposed to a pulse of silane, and the chamber may be purged again, and such operations may be repeated in cycles.

Nucleation layer deposition that may be used in any of the above described implementations may include co-flowing any one of hydrogen ($H_2$), argon (Ar), nitrogen ($N_2$), or combinations thereof during the entire nucleation deposition process, or during a silane dose, or during a diborane dose, or during a tungsten-containing precursor dose such as $WF_6$ dose, or during any purge times. In some embodiments, a surface treatment operation may be performed during or after nucleation growth by exposing the substrate to any of silane, disilane, trisilane, germane, diborane, hydrogen, tungsten hexafluoride, nitrogen, argon, and combinations thereof. For example, during deposition of a nucleation layer, the substrate may be exposed to alternating pulses of silane and $WF_6$, then the substrate may be exposed to a silane soak, then the substrate may resume being exposed to alternating pulses of silane and $WF_6$. Such operations may be performed in cycles. For example, in some embodiments, the following cycle may be repeated one or more times to deposit a nucleation layer: alternating pulses of $SiH_4$ and $WF_6$ and exposure to a surface treatment.

In some embodiments, the nucleation layer may be deposited by exposing the substrate to any combination of the tungsten-containing precursor and any one or more of the following gases in any sequence and order, in one or more cycles: diborane, silane, disilane, trisilane, hydrogen, nitrogen, and germane ($GeH_4$). For example, in some embodiments, a nucleation layer may be deposited by exposing the substrate to diborane, exposing the substrate to tungsten hexafluoride, exposing the substrate to silane, and exposing the substrate to hydrogen. Such operations may be repeated in one or more cycles. In another example, in some embodiments, a nucleation layer may be deposited by exposing the substrate to silane, exposing the substrate to tungsten hexafluoride, and exposing the substrate to hydrogen. Such operations may be repeated in one or more cycles. In another example, in some embodiments, a nucleation layer may be deposited by exposing the substrate to diborane, exposing the substrate to hydrogen, and exposing the substrate to tungsten hexafluoride. Such operations may be repeated in one or more cycles. In another example, in some embodiments, a nucleation layer may be deposited by exposing the substrate to nitrogen, exposing the substrate to diborane, and exposing the substrate to tungsten hexafluoride. Such operations may be repeated in one or more cycles. In another example, in some embodiments, a nucleation layer may be deposited by exposing the substrate to silane, exposing the substrate to nitrogen, and exposing the substrate to tungsten hexafluoride. Such operations may be repeated in one or more cycles. In any of the described embodiments, the substrate may be exposed to surface treatment and/or soaking operations before, during, or after deposition of the nucleation cycle using any available gas. In some embodiments, additional gases may be co-flowed with any of the above described gases during one or more exposures of the nucleation deposition process. In any of the disclosed embodiments, a chamber housing the substrate may be purged between one or more dose operations for depositing a nucleation layer. Purging may be performed by flowing an inert gas such as argon into the chamber. Any suitable inert gas may be used for purging. It will be understood that in some embodiments, the substrate may be periodically exposed to nitrogen during deposition of a tungsten nucleation layer.

During any of the above described exposures, the gases may be pulsed or flowed continuously. For example, in some embodiments, during a $WF_6$ dose of a sequential CVD operation, $WF_6$ may be pulsed one or more times during a single dose. Likewise, in some embodiments, during a purge, an inert gas may be pulsed during one or more times during a single purge operation. Such pulsing operations may be performed during any operation of nucleation deposition or any operation of bulk deposition or any combination thereof. In some embodiments, one or more changes to one or more parameters such as pressure, flow rate, and temperature, may be used. In some embodiments, the pedestal may be moved during any operation of the nucleation deposition or bulk deposition or both such that the gap between the substrate and a showerhead over the pedestal may be modulated. Moving the pedestal may be used in combination with altering one or more parameters such as pressure, temperature, or flow rate. Modulating the gap between the substrate and the showerhead can affect the pressure, temperature, or flow rate that may be used in accordance with certain disclosed embodiments. It will be understood that any of the processes described herein may be applicable to techniques involving ALD.

Bulk Layer Deposition

Bulk deposition as described herein may be performed simultaneous exposure of two reactants, such that both reactants are flowed at the same time during deposition. For example, bulk tungsten may be deposited by exposing a substrate to hydrogen ($H_2$) and tungsten hexafluoride ($WF_6$) at the same time for a duration sufficient to fill features. Hydrogen and $WF_6$ react during the exposure to deposit tungsten into the features. In pulsed CVD processes, one reactant is continuously flowed while the other reactant is pulsed, but the substrate is exposed to both reactants during deposition to deposit material during each pulse. For example, a substrate may be exposed to a continuous flow of $H_2$ while $WF_6$ is pulsed, and $WF_6$ and $H_2$ react during the pulse to deposit tungsten.

In some embodiments, bulk deposition may involve separate exposures to each reactant such that the reactants are not flowed into the chamber at the same time during deposition. Rather, each reactant flow is introduced to a chamber housing the substrate in temporally separated pulses in sequence, repeated one or more times in cycles.

Metal-Containing Precursors

While the above description chiefly describes tungsten layers, the methods may be implemented for feature fill using other metals including molybdenum, cobalt, and ruthenium.

Examples of Mo precursors for ALD of molybdenum materials include molybdenum halides such $MoF_6$ and $MoCl_6$, molybdenum oxyhalides such as molybdenum dichloride dioxide ($MoO_2Cl_2$) and molybdenum tetrachloride oxide ($MoOCl_4$), and molybdenum hexacarbonyl ($Mo(CO)_6$). Other Mo oxyhalides of the formula $Mo_xOyHal_y$ where Hal is a halogen (fluorine (F), chlorine (Cl), bromine (Br), or iodine (I)) and x, y, and z are any number greater than zero that can form a stable molecule. These include molybdenum tetrafluoride oxide ($MoOF_4$), molybdenum dibromide dioxide ($MoO_2Br_2$), and molybdenum oxyiodides $MoO_2I$ and $Mo_4O_{11}I$.

In certain embodiments, organo-metallic precursors may also be used with examples including Mo precursors having cyclopentadienyl ligands. Further examples include precursors of the formula $Mo_2Ln$, wherein each L is independently selected from an amidate ligand, an amidinate ligand, and a guanidinate ligand, where n is 2-5. The $Mo_2Ln$ precursor includes a multiple molybdenum-molybdenum bond (such as a double bond or any multiple bond with a bond order of 2-5). Further examples include halide-containing heteroleptic molybdenum compounds (i.e., compounds having different types of ligands). Particular examples of such precursors are compounds that include molybdenum, at least one halide forming a bond with molybdenum, and at least one organic ligand having any of the N, O, and S elements, where an atom of any of these elements forms a bond with molybdenum. Examples of suitable organic ligands that provide nitrogen or oxygen bonding include amidinates, amidates, iminopyrrolidinates, diazadienes, beta-imino amides, alpha-imino alkoxides, beta-amino alkoxides, beta-diketiminates, beta-ketoiminates, beta-diketonates, amines, and pyrazolates. Examples of suitable organic ligands that provide sulfur bonding include thioethers, thiolates, dithiolenes, dithiolates, and α-imino thiolenes. These ligands may be substituted or unsubstituted. In some embodiments, these ligands include one or more substituents independently selected from the group consisting of H, alkyl, fluoroalkyl, alkylsilyl, alkylamino, and alkoxy substituents. The organic ligands can be neutral or anionic (e.g., monoanionic or dianionic), and molybdenum can be in a variety of oxidation states, such as +1, +2, +3, +4, +5, and +6.

To deposit ruthenium (Ru), Ru-precursors may be used. Examples of ruthenium precursors that may be used for oxidative reactions include (ethylbenzyl)(1-ethyl-1,4-cyclohexadienyl)Ru(0), (1-isopropyl-4-methylbenzyl)(1,3-cyclohexadienyl)Ru(0), 2,3-dimethyl-1,3-butadienyl)Ru(0)tricarbonyl, (1,3-cyclohexadienyl)Ru(0)tricarbonyl, and (cyclopentadienyl)(ethyl)Ru(II)dicarbonyl. Examples of ruthenium precursors that react with non-oxidizing reactants are bis(5-methyl-2,4-hexanediketonato)Ru(II)dicarbonyl and bis(ethylcyclopentadienyl)Ru(II).

To deposit cobalt (Co), cobalt-containing precursors including dicarbonyl cyclopentadienyl cobalt (I), cobalt carbonyl, various cobalt amidinate precursors, cobalt diazadienyl complexes, cobalt amidinate/guanidinate precursors, and combinations thereof may be used.

While $WF_6$ is used as an example of a tungsten-containing precursor, it should be understood that other tungsten-containing precursors may be suitable for performing disclosed embodiments. For example, a metal-organic tungsten-containing precursor may be used. Organo-metallic precursors and precursors that are free of fluorine, such as MDNOW (methylcyclopentadienyl-dicarbonylnitrosyl-tungsten) and EDNOW (ethylcyclopentadienyl-dicarbonylnitrosyl-tungsten) may also be used. Chlorine-containing tungsten precursors ($WCl_x$) such as tungsten pentachloride ($WCl_5$) and tungsten hexachloride ($WCl_6$) may be used.

The metal-containing precursor may be reacted with a reducing agent as described above. In some embodiments, $H_2$ is used as a reducing agent for bulk layer deposition to deposit high purity films.

In some embodiments, the bulk layer is deposited using CVD filling of the feature is performed at a reduced temperature. According to various embodiments, the reduced temperature (substrate temperature) is in one of the following ranges: between about 250-350° C., between about 250° C.-340° C., between about 250° C.-330° C., between about 250° C.-325° C., between about 250° C.-320° C., between about 250° C.-315° C., between about 250° C.-310° C., between about 250° C.-305° C., or between about 250° C.-300° C. Also according to various embodiments, the substrate temperature is: between about 260-310° C., between about 270° C.-310° C., between about 280° C.-310° C., or between about 290° C.-310° C. In certain embodiments, the process and/or substrate temperature is about 300° C. Reduced temperature CVD can be used to obtain high quality fill in narrow, high aspect ratio features.

Apparatus

Any suitable chamber may be used to implement the disclosed embodiments. Example deposition apparatuses include various systems, e.g., ALTUS® and ALTUS® Max, available from Lam Research Corp., of Fremont, California, or any of a variety of other commercially available processing systems. In some embodiments, sequential chemical vapor deposition (CVD) may be performed at a first station that is one of two, five, or even more deposition stations positioned within a single deposition chamber. Thus, for example, diborane ($B_2H_6$) and tungsten hexafluoride ($WF_6$) may be alternately introduced to the surface of the semiconductor substrate, at the first station, using an individual gas supply system that creates a localized atmosphere at the substrate surface to deposit a nucleation layer. Another station may be used for deposition of the amorphous layer. Another station may be used to deposit the bulk metal layer at low pressure. In some embodiments, temperature is individually controlled. For example, temperature may be higher at an amorphous layer station to increase incorporation of an impurity.

In implementations in which a inhibition treatment is performed, one station may be used for treatment of the nucleation layer. Another station may be used to deposit the bulk metal layer. In some embodiments, temperature is individually controlled. For example, temperature may be lower at a treatment station to allow a discontinuous and conformal treatment to be applied.

Two or more stations may be used to deposit tungsten in a parallel processing. Alternatively a wafer may be indexed to have deposition operations performed over two or more stations sequentially.

Figure 11:
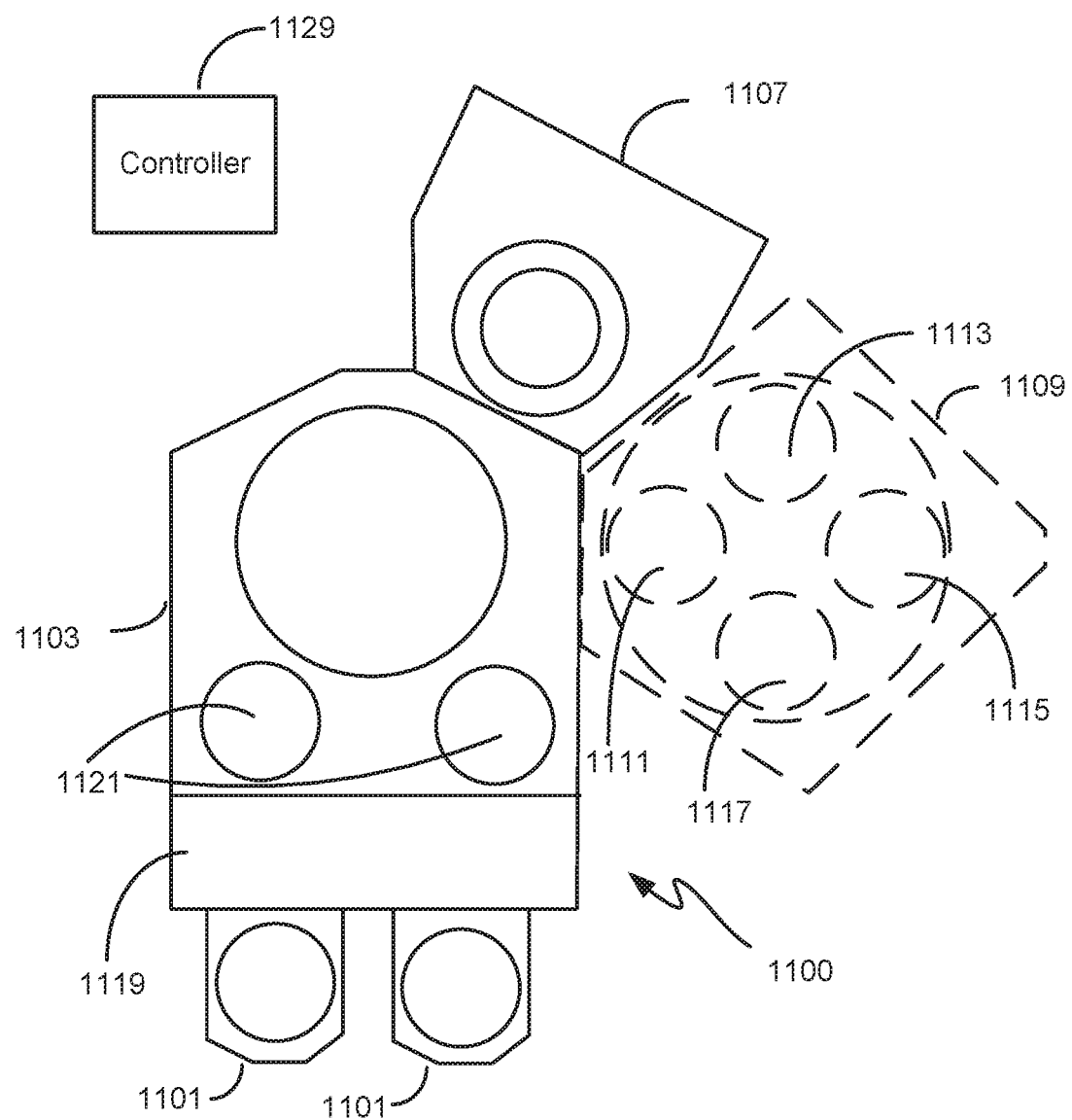
FIG. 11 is a schematic diagram of an example process tool for performing disclosed embodiments.

FIG. 11 is a block diagram of a processing system suitable for conducting tungsten thin film deposition processes in accordance with embodiments. The system 1000 includes a transfer module 1003. The transfer module 1103 provides a clean, pressurized environment to minimize risk of contamination of substrates being processed as they are moved between various reactor modules. Mounted on the transfer module 1103 is a multi-station reactor 1109 capable of performing ALD and CVD with according to embodiments. Reactor 1109 may include multiple stations 1111, 1113, 1115, and 1117 that may sequentially perform operations in accordance with disclosed embodiments. For example, reactor 1109 could be configured such that station 1111 performs nucleation layer deposition by ALD, station 1113 performs amorphous layer deposition, and stations 1115 and 1117 perform bulk layer deposition by CVD or ALD.

In another example, reactor 1109 could be configured such that station 1111 performs nucleation layer deposition by ALD, station 1113 performs treatment of the nucleation layer, and stations 1115 and 1117 performs bulk metal layer deposition of ALD or CVD.

Figure 12:
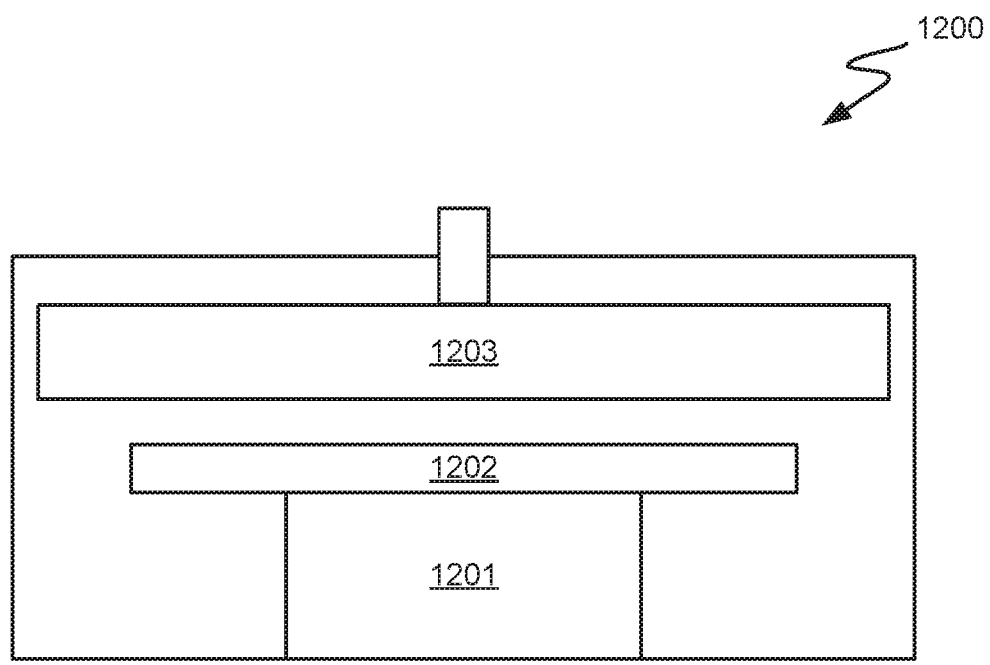
FIG. 12 is a schematic diagram of an example station for performing disclosed embodiments.

Stations may include a heated pedestal or substrate support, one or more gas inlets or showerhead or dispersion plate. An example of a deposition station 1200 is depicted in FIG. 12, including substrate support 1202 and showerhead 1203. A heater may be provided in pedestal portion 1201.

Also mounted on the transfer module 1103 may be one or more single or multi-station modules 1107 capable of performing plasma or chemical (non-plasma) pre-cleans. The module may also be used for various treatments to, for example, prepare a substrate for a deposition process. In some embodiments, a module 1107 may be used for a plasma inhibition treatment for example.

The system 1100 also includes one or more wafer source modules 1201, where wafers are stored before and after processing. An atmospheric robot (not shown) in the atmospheric transfer chamber 1119 may first remove wafers from the source modules 1101 to loadlocks 1121. A wafer transfer device (generally a robot arm unit) in the transfer module 1103 moves the wafers from loadlocks 1121 to and among the modules mounted on the transfer module 1103.

In various embodiments, a system controller 1129 is employed to control process conditions during deposition. The controller 1129 will typically include one or more memory devices and one or more processors. A processor may include a CPU or computer, analog and/or digital input/output connections, stepper motor controller boards, etc.

The controller 1129 may control all of the activities of the deposition apparatus. The system controller 1129 executes system control software, including sets of instructions for controlling the timing, mixture of gases, chamber pressure, chamber temperature, wafer temperature, radio frequency (RF) power levels, wafer chuck or pedestal position, and other parameters of a particular process. Other computer programs stored on memory devices associated with the controller 1129 may be employed in some embodiments.

Typically there will be a user interface associated with the controller 1129. The user interface may include a display screen, graphical software displays of the apparatus and/or process conditions, and user input devices such as pointing devices, keyboards, touch screens, microphones, etc.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general purpose processor. System control software may be coded in any suitable computer readable programming language.

The computer program code for controlling the germanium-containing reducing agent pulses, hydrogen flow, and tungsten-containing precursor pulses, and other processes in a process sequence can be written in any conventional computer readable programming language: for example, assembly language, C, C++, Pascal, Fortran, or others. Compiled object code or script is executed by the processor to perform the tasks identified in the program. Also as indicated, the program code may be hard coded.

The controller parameters relate to process conditions, such as, for example, process gas composition and flow rates, temperature, pressure, cooling gas pressure, substrate temperature, and chamber wall temperature. These parameters are provided to the user in the form of a recipe, and may be entered utilizing the user interface.

Signals for monitoring the process may be provided by analog and/or digital input connections of the system controller 1129. The signals for controlling the process are output on the analog and digital output connections of the deposition apparatus 1100.

The system software may be designed or configured in many different ways. For example, various chamber component subroutines or control objects may be written to control operation of the chamber components necessary to carry out the deposition processes in accordance with the disclosed embodiments. Examples of programs or sections of programs for this purpose include substrate positioning code, process gas control code, pressure control code, and heater control code.

In some implementations, a controller 1129 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 1229, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings in some systems, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 1129, in some implementations, may be a part of or coupled to a computer that is integrated with, coupled to the system, otherwise networked to the system, or a combination thereof. For example, the controller 1129 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a CVD chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The controller 1129 may include various programs. A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition, flow rates, pulse times, and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition include mass flow controllers, pressure sensors such as manometers, and thermocouples located in the pedestal or chuck. Appropriately programmed feedback and control algorithms may be used with data from these sensors to maintain desired process conditions.

The foregoing describes implementation of disclosed embodiments in a single or multi-chamber semiconductor processing tool. The apparatus and process described herein may be used in conjunction with lithographic patterning tools or processes, for example, for the fabrication or manufacture of semiconductor devices, displays, LEDs, photovoltaic panels, and the like. Typically, though not necessarily, such tools/processes will be used or conducted together in a common fabrication facility. Lithographic patterning of a film typically includes some or all of the following steps, each step provided with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

CONCLUSION

Although the foregoing embodiments have been described in some detail for purposes of clarity of understanding, it will be apparent that certain changes and modifications may be practiced within the scope of the appended sample claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method comprising:
   (a) providing a substrate having a plurality of features spaced apart, each feature having a feature opening width, wherein the width of at least some of the features narrows from the top of the feature to the bottom of the feature;
   (b) depositing a conformal amorphous metal-based layer in the features;
   (c) after depositing the conformal amorphous metal-based layer, depositing a bulk metal layer in the features; and
   (d) prior to depositing the bulk metal layer, depositing a metal nucleation layer in the features, wherein the metal nucleation layer has a higher percentage of metal than in the amorphous metal-based layer.

2. The method of claim 1, wherein the width of the bottom of each feature is between 0 nm and 90% of the width at the top of the feature.

3. The method of claim 1, wherein the metal is selected from the group consisting of tungsten, ruthenium, molybdenum, and cobalt.

4. The method of claim 1, further comprising annealing the conformal amorphous metal-based layer.

5. The method of claim 1, wherein the features are spaced apart with a pitch of between about 10 nm and 60 nm between adjacent features.

6. The method of claim 1, wherein (d) is performed prior to depositing the amorphous metal-based layer.

7. The method of claim 1, wherein the metal-based layer comprises at least 50 atomic % metal.

8. The method of claim 1, wherein the metal-based layer further comprises one or more of boron (B), nitrogen (N), carbon (C), silicon (Si), and germanium (Ge).

9. The method of claim 1, wherein the conformal amorphous metal-based layer comprises a metal selected from tungsten (W), ruthenium (Ru), molybdenum (Mo), titanium (Ti), tantalum (Ta), and cobalt (Co) and wherein the metal-based layer is at least 5% (atomic) of an impurity selected from boron (B), nitrogen (N), carbon (C), silicon (Si), germanium (Ge), and combinations thereof.

10. The method of claim 9, wherein the plurality of features are filled with a film selected from titanium nitride and tantalum nitride.

11. The method of claim 1, further comprising after performing (c), repeating (b) and (c) one or more times to fill the feature.

12. A method comprising:
    (a) providing a substrate having a plurality of features spaced apart, each feature having a feature opening width, wherein the width of the feature narrows from the top of the feature to the bottom of the feature;
    (b) depositing a bulk metal layer in the features; and
    (c) after depositing the bulk metal layer in the features, depositing an amorphous metal-based layer in the features, wherein the bulk metal layer is thicker than the amorphous metal-based layer and has a higher percentage of metal than in the amorphous metal-based layer.

13. The method of claim 12, wherein the metal of metal-based layer is selected from the group consisting of tungsten, ruthenium, molybdenum, and cobalt.

14. The method of claim 12, further comprising repeating (b) one or more times to fill the feature.

15. The method of claim 14, further comprising repeating (c) one or more times to fill the feature.

16. The method of claim 15, wherein the bulk films together form the main conductor of the filled feature.

17. The method of claim 12, further comprising annealing the conformal amorphous metal-based layer.

18. The method of claim 12, further comprising depositing a metal nucleation layer in the features.

19. The method of claim 12, wherein the metal-based layer comprises at least 50% metal.

20. The method of claim 19, wherein the metal-based layer further comprises one or more of boron (B), nitrogen (N), carbon (C), silicon (Si), and germanium (Ge).

21. A method comprising:
(a) providing a substrate having a plurality of features spaced apart, each feature having a feature opening width, wherein the width of the feature narrows from the top of the feature to the bottom of the feature;
(b) depositing a conformal, discontinuous film in the features including discontinuities in the features and/or or adsorbing metal species non-uniformly throughout each feature; and (c) after (b), depositing a bulk layer in the features.

* * * * *